(12) United States Patent
Meguro et al.

(10) Patent No.: US 8,294,642 B2
(45) Date of Patent: Oct. 23, 2012

(54) DISPLAY DEVICE, PICTURE SIGNAL PROCESSING METHOD, AND PROGRAM

(75) Inventors: Takeya Meguro, Minato-ku (JP); Ken Kikuchi, Minato-ku (JP); Yasuo Inoue, Minato-ku (JP); Toyo Osumi, Shinagawa-ku (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 12/598,127

(22) PCT Filed: May 23, 2008

(86) PCT No.: PCT/JP2008/059547
§ 371 (c)(1),
(2), (4) Date: Oct. 29, 2009

(87) PCT Pub. No.: WO2008/146742
PCT Pub. Date: Dec. 4, 2008

(65) Prior Publication Data
US 2010/0127957 A1 May 27, 2010

(30) Foreign Application Priority Data
May 25, 2007 (JP) .................................. 2007-139658

(51) Int. Cl.
*G09G 3/30* (2006.01)
(52) U.S. Cl. .............. 345/77; 345/82; 345/84; 345/690; 345/204
(58) Field of Classification Search .................... 345/76, 345/77, 82, 83, 204, 208–213, 690, 84; 250/552, 250/553; 315/169.3
See application file for complete search history.

(56) References Cited

U.S. PATENT DOCUMENTS

| 6,313,816 | B1 * | 11/2001 | Kojima et al. | 345/83 |
| 6,987,787 | B1 * | 1/2006 | Mick | 372/29.021 |
| 7,292,236 | B2 * | 11/2007 | Abe et al. | 345/204 |
| 7,295,197 | B2 * | 11/2007 | Abe et al. | 345/211 |
| 7,477,248 | B2 * | 1/2009 | Johnson | 345/214 |
| 7,564,434 | B2 * | 7/2009 | Kim | 345/82 |

(Continued)

FOREIGN PATENT DOCUMENTS
JP 2005 107536 4/2005
(Continued)

OTHER PUBLICATIONS

U.S. Appl. No. 12/668,150, filed Jan. 7, 2010, Inoue, et al.
Supplementary European Search Report issued Sep. 16, 2010, in European Patent Application No. 08764593.3.

*Primary Examiner* — Lun-Yi Lao
*Assistant Examiner* — Tom Sheng
(74) *Attorney, Agent, or Firm* — Oblon, Spivak, McClelland, Maier & Neustadt, L.L.P.

(57) ABSTRACT

There is provided a display device including a display unit having pixels, each of which includes a luminescence element that individually becomes luminous depending on a current amount and a pixel circuit for controlling a current applied to the luminescence element according to a voltage signal, where the pixels are arranged in a matrix pattern. The display device includes a luminescence amount regulator for setting a reference duty for regulating a luminescence amount for each one frame, according to the input picture signal, and an adjuster for adjusting an effective duty that regulates, for each one frame, a luminous time for which the luminescence element is luminous, and a gain of the picture signal, based on the reference duty and the input picture signal, so that the luminescence amount is constant before and after adjustment.

19 Claims, 21 Drawing Sheets

U.S. PATENT DOCUMENTS

| | | |
|---|---|---|
| 2004/0066356 A1 | 4/2004 | Yun et al. |
| 2005/0078062 A1 | 4/2005 | Yoon et al. |
| 2005/0231449 A1 | 10/2005 | Miyagawa |
| 2005/0285828 A1* | 12/2005 | Inoue et al. ............... 345/76 |
| 2006/0279480 A1* | 12/2006 | Johnson et al. ............ 345/63 |
| 2006/0279490 A1 | 12/2006 | Park et al. |
| 2007/0103408 A1 | 5/2007 | Tada et al. |

FOREIGN PATENT DOCUMENTS

| | | |
|---|---|---|
| JP | 2005 301095 | 10/2005 |
| JP | 2006 38967 | 2/2006 |
| JP | 2007 25317 | 2/2007 |
| WO | 2004/047061 A2 | 6/2004 |
| WO | 2004/047061 A3 | 6/2004 |

* cited by examiner

DISPLAY DEVICE, PICTURE SIGNAL PROCESSING METHOD, AND PROGRAM

TECHNICAL FIELD

The present invention relates to a display device, a method of processing a picture signal, and a program.

BACKGROUND ART

In recent years, various display devices, such as organic EL displays (organic ElectroLuminescence displays, also called as OLED displays (Organic Light Emitting Diode displays)), FEDs (Field Emission Displays), PDPs (Plasma Display Panels), and the like, have been developed as devices to replace CTR displays (Cathode Ray Tube displays).

Amongst the various display devices mentioned above, the organic EL displays are self-luminescence type display devices that use an electroluminescence phenomenon. They have drawn particular attention of people as devices for the next generation, because they are superior to display devices in their moving image characteristics, viewing angle characteristics, colour reproducibility, etc.

In such circumstances, various techniques related to the self-luminescence type display devices have been developed. An example of the techniques related to luminous time control for one frame period on a self-luminescence type display device can be found in the following Patent Document 1.

Patent Document 1: JP 2006-038967 (A)

DISCLOSURE OF THE INVENTION

Object to be Achieved by the Invention

However, the typical techniques related to luminous time control for one frame period controls a luminous time and the gain of a picture signal to make them smaller for a higher average luminance of the picture signal. Thus, with a self-luminescence display device in which the typical techniques related to luminous time control for one frame period is used, luminance reduction occurs since the luminescence amount of a picture displayed (signal level of picture signal×luminous time) will be smaller than the luminescence amount indicated by a picture signal input.

The present invention is made in view of the above-mentioned issue, and aims to provide a display device, a method of processing a picture signal, and a program, which are novel and improved, and which are capable of providing high definition by controlling a luminous time within one frame period and a gain of a picture signal.

Solution for Achieving the Problems

According to the first aspect of the present invention in order to achieving the above-mentioned object, there is provided a display device including a display unit having pixels, each of which includes a luminescence element that individually becomes luminous depending on a current amount and a pixel circuit for controlling a current applied to the luminescence element according to a voltage signal, scan lines which supply a selection signal for selecting pixels to be luminous to the pixels in a predetermined scanning cycle, and data lines which supply to the pixels the voltage signal according to an input picture signal, the pixels, the scan lines, and the data lines arranged in a matrix pattern, the display device including a luminescence amount regulator for setting a reference duty for regulating a luminescence amount for each one frame, according to the input picture signal, and an adjuster for adjusting an effective duty that regulates, for each one frame, a luminous time for which the luminescence element is luminous, and a gain of the picture signal, based on the reference duty and the input picture signal. The adjuster adjusts the effective duty and the gain of the picture signal so that the luminescence amount for each one frame regulated with the reference duty and the picture signal equals to a luminescence amount for each one frame regulated with the adjusted effective duty and the adjusted gain of the picture signal.

The display device can include a luminescence amount regulator and an adjuster. The luminescence amount regulator can set a reference duty for regulating a luminescence amount for each one frame, according to the input picture signal. The adjuster can adjust an effective duty that regulates, for each one frame, a luminous time for which the luminescence element is luminous, and a gain of the picture signal, based on the reference duty and the input picture signal. Now, the adjuster can adjust the effective duty and the gain of the picture signal so that the luminescence amount for each one frame regulated by the reference duty and the picture signal equals to the luminescence amount for each one frame regulated by the reference duty and the picture signal after adjustment.

Also, the adjuster may adjust the effective duty to be smaller, as a signal level of the input picture signal is smaller, so that the gain of the picture signal is amplified.

According to such a configuration, blurred movement in the display of a picture or an image can be made smaller.

Also, the adjuster may include a luminous time adjuster for adjusting the effective duty, based on a maximum value of luminance of the picture signal for a predetermined period and the reference duty, and a gain adjuster for adjusting the gain of the picture signal, based on the reference duty set by the luminescence amount regulator and the effective duty adjusted by the luminous time adjuster.

According to such a configuration, a luminous time within one frame period and the gain of a picture signal can be controlled.

Also, the luminous time adjuster may set the effective duty to a value equal to or smaller than the reference duty, and the gain adjuster may amplify the gain of the picture signal according to a reduction ratio of the effective duty to the reference duty.

According to such a configuration, high definition can be achieved with the luminescence amount maintained.

Also, the luminous time adjuster may includes a peak detector for detecting the maximum value of the luminance of the input picture signal for the predetermined period, and a luminous time adjuster for outputting the effective duty obtained by multiplying the reference duty by the maximum value of the luminance detected by the peak detector. The gain adjuster may includes a first gain adjuster for multiplying the input picture signal by the reference duty, and a second gain adjuster for dividing the adjusted picture signal output from the first gain adjuster by the effective duty output from the luminous time adjuster.

According to such a configuration, a luminous time within one frame period and the gain of a picture signal can be controlled with the luminescence amount maintained as the same.

An average luminance calculator for calculating average luminance for a predetermined period of the input picture signal may be included. The luminescence amount regulator may set the reference duty depending on the average luminance calculated by the average luminance calculator.

According to such a configuration, a luminous time within one frame period and the gain of a picture signal can be controlled with the luminescence amount maintained as the same.

Also, the average luminance calculator may include a current ratio adjuster for multiplying primary colour signals of the picture signal respectively by adjustment values for the respective primary colour signals based on a voltage-current characteristic, and an average value calculator for calculating average luminance for the predetermined period of the picture signals output from the current ratio adjuster.

According to such a configuration, a picture and an image can be displayed accurately according to a picture signal input.

Also, the luminescence amount regulator may hold a look-up table in which luminance of a picture signal is correlated to the reference duty, and set the reference duty unique to the average luminance calculated by the average luminance calculator.

According to such a configuration, a luminescence amount for each one frame can be regulated.

Also, a linear converter for adjusting the input picture signal to a linear picture signal by gamma adjustment may be included. The picture signal input into the adjuster may be the picture signal output from the linear converter.

According to such a configuration, a luminous time within one frame period and the gain of a picture signal can be controlled with the luminescence amount maintained as the same.

Also, a gamma converter for performing gamma adjustment according to a gamma characteristic of the display unit on the picture signal adjusted by the adjuster may be included.

According to such a configuration, a luminescence amount for each one frame can be regulated.

Also, according to the second aspect of the present invention in order to solve the above-mentioned object, there is provided a picture signal processing method for a display device including a display unit having pixels, each of which includes a luminescence element that individually becomes luminous depending on a current amount and a pixel circuit for controlling a current applied to the luminescence element according to a voltage signal, scan lines which supply a selection signal for selecting pixels to be luminous to the pixels in a predetermined scanning cycle, and data lines which supply to the pixels the voltage signal according to an input picture signal, the pixels, the scan lines, and the data lines arranged in a matrix pattern, the picture signal processing method comprising the steps of setting a reference duty for regulating a luminescence amount for each one frame, according to the input picture signal, and adjusting an effective duty that regulates, for each one frame, a luminous time for which the luminescence element is luminous, and a gain of the picture signal, based on the reference duty and the input picture signal. The step of adjusting may adjust the effective duty and the gain of the picture signal so that the luminescence amount for each one frame regulated with the reference duty and the picture signal equals to a luminescence amount for each one frame regulated with the adjusted effective duty and the adjusted gain of the picture signal.

By use of such a method, a luminous time within one frame period and the gain of a picture signal can be controlled with the luminescence amount maintained as the same.

The step of adjusting may adjust the effective duty to be smaller, as a signal level of the input picture signal is smaller, so that the gain of the picture signal may be amplified.

By use of such a method, blurred movement in the display of a picture or an image can be made smaller.

The step of adjusting may includes a first step of adjusting the effective duty, based on a maximum value of luminance of the picture signal for a predetermined period and the reference duty, and a second step of adjusting the gain of the picture signal, based on the reference duty set in the step of adjusting and the effective duty adjusted in the first step.

By use of such a method, a luminous time within one frame period and the gain of a picture signal can be controlled with the luminescence amount maintained as the same.

Also, the first step may sets the effective duty to a value equal to or smaller than the reference duty, and the second step may amplify the gain of the picture signal according to a reduction ratio of the effective duty to the reference duty.

By use of such a method, high definition can be achieved with the luminescence amount maintained.

Also, the first step may include a third step of detecting the maximum value of the luminance of the input picture signal for the predetermined period, and a forth step of outputting the effective duty obtained by multiplying the reference duty by the maximum value of the luminance detected in the third step. The second step may include a fifth step of multiplying the input picture signal by the reference duty, and a sixth step of dividing the adjusted picture signal output by the fifth step by the effective duty output by the forth step.

By use of such a method, a luminous time within one frame period and the gain of a picture signal can be controlled with the luminescence amount maintained as the same.

Also, the step of calculating average luminance for a predetermined period of the input picture signal may be included. The step of setting may set the reference duty depending on the average luminance calculated in the step of calculating average luminance.

By use of such a method, a luminous time within one frame period and the gain of a picture signal can be controlled with the luminescence amount maintained as the same.

Also, the step of calculating average luminance may include a seventh step of multiplying primary colour signals of the picture signal respectively by adjustment values for respective primary colour signals based on a voltage-current characteristic, and an eighth step of calculating average luminance for the predetermined period of the picture signals output by the seventh step.

By use of such a method, a picture and an image can be displayed accurately according to a picture signal input.

Also, a look-up table in which luminance of a picture signal is correlated to the reference duty may be held in the step of adjusting, and the step of adjusting may set the reference duty unique to the average luminance calculated by the step of calculating average luminance.

By use of such a method, a luminescence amount for each one frame can be regulated.

Also, the step of adjusting the input picture signal to a linear picture signal by gamma adjustment may be included. The picture signal input in the step of adjusting may be the picture signal output by the step of adjusting to a linear picture signal.

By use of such a method, a luminous time within one frame period and the gain of a picture signal can be controlled with the luminescence amount maintained as the same.

Also the step of performing gamma adjustment according to a gamma characteristic of the display unit on the picture signal adjusted in the step of adjusting may be included.

By use of such a method, a picture and an image can be displayed accurately according to a picture signal input.

Also, according to the third aspect of the present invention in order to solve the above-mentioned object, there is provided a program related to a display device including a display unit having pixels, each of which includes a luminescence element that individually becomes luminous depending on a current amount and a pixel circuit for controlling a current applied to the luminescence element according to a voltage signal, scan lines which supply a selection signal for selecting the pixels to be luminous to the pixels in a predetermined scanning cycle, and data lines which supply to the pixels the voltage signal according to an input picture signal, the pixels, the scan lines, and the data lines arranged in a matrix pattern, the program configured to cause a computer to function as means for setting a reference duty for regulating a luminescence amount for each one frame, according to the input picture signal, and means for adjusting an effective duty that regulates, for each one frame, a luminous time for which the luminescence element is luminous, and a gain of the picture signal, based on the reference duty and the input picture signal.

According to such a program, a luminous time within one frame period and the gain of a picture signal can be controlled with the luminescence amount maintained as the same.

Advantage of the Invention

According the present invention, high definition can be provided by controlling a luminous time within one frame period and the gain of a picture signal.

Figure 1:
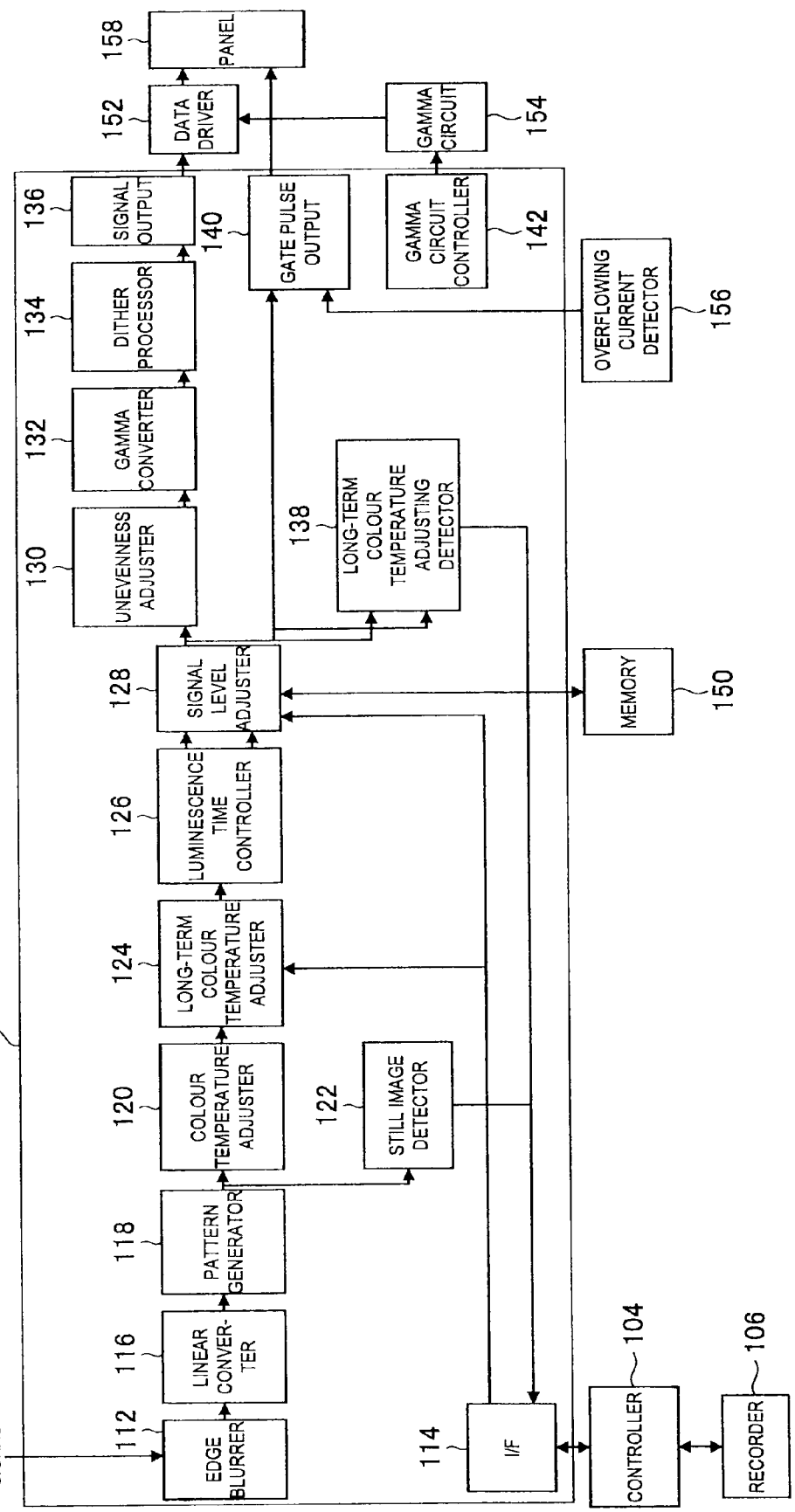
FIG. 1 is an illustration that shows one example of the configuration of a display device according to an embodiment of the present invention.

EXPLANATION OF REFERENCE NUMERALS 100 display device
110 picture signal processor
116 linear converter
126 luminous time controller
132 gamma converter
200 average luminance calculator
202 luminescence amount regulator
204 adjuster
206 luminous time adjuster
208 gain adjuster
210 peak detector
212 luminous time adjuster
214 first gain adjuster
216 second gain adjuster
250 current ratio adjuster
252 average value calculator

BEST MODE FOR CARRYING OUT THE INVENTION

Hereinafter, preferred embodiments of the present invention will be described in detail with reference to the appended drawings. Note that, in this specification and the drawings, elements that have substantially the same function and structure are denoted with the same reference numerals, and repeated explanation is omitted.

(Example of Display Device According to Embodiment of Invention)

First, an example of the configuration of a display device according to an embodiment of the present invention will be described. FIG. 1 is an illustration that shows an example of the configuration of the display device 100 according to an embodiment of the present invention. Besides, in the following, an organic EL display, which is a self-luminescence display device, will be described as an example of the display devices according to an embodiment of the present invention. Also, in the following, the explanation will be provided with assumption that a picture signal input into the display device 100 is a digital signal used in digital broadcasting, for example, though it is not limited as such; for example, such a picture signal may be an analogue signal used in analogue broadcasting, for example.

With reference to FIG. 1, the display device 100 includes a controller 104, a recorder 106, a picture signal processor 110, a memory 150, a data driver 152, a gamma circuit 154, an overflowing-current detector 156, and a panel 158.

The controller 104 includes an MPU (Micro Processing Unit), for example, and controls the entire display device 100. The control that is executed by the controller 104 includes executing a signal process on a signal transmitted from the picture signal processor 110, and passing a processing result to the picture signal processor 110. Now, the above signal process by the controller 104 includes, for example, calculating a gain for use in adjustment on the luminance of an image to be displayed on the panel 158, but is not limited thereto.

The recorder 106 is one means for storing included in the display device 100, and able to hold information for controlling the picture signal processor 110 by the controller 104. The information held in the recorder 106 includes, for example, a table in which parameters are preset for executing by the controller 104 a signal process on a signal transmitted from the picture signal processor 110. And, examples of the recorder 106 include, but are not limited to, magnetic recording media like Hard Disks, and non volatile memories like EEPROMs (Electrically Erasable and Programmable Read Only Memories), flash memories, MRAMs (Magnetoresistive Random Access Memories), FeRAMs (Ferroelectric Random Access Memories), and PRAMs (Phase change Random Access Memories).

The signal processor 110 can perform a signal process on a picture signal input. In the following, an example of the configuration of the picture signal processor 110 will be explained.

[One Example of Configuration of Picture Signal Processor 110]

The signal processor 110 includes an edge blurrer 112, an I/F 114, a linear converter 116, a pattern generator 118, a colour temperature adjuster 120, a still image detector 122, a long-term colour temperature adjuster 124, a luminous time controller 126, a signal level adjuster 128, an unevenness adjuster 130, a gamma converter 132, a dither processor 134, a signal output 136, a long-term colour temperature adjusting detector 138, a gate pulse output 140, and a gamma circuit controller 142.

The edge blurrer 112 executes on an input picture signal a signal process for blurring the edge. Specifically, the edge blurrer 112 prevents a sticking phenomenon of an image onto the panel 158 (which will be described later) by intentionally shifting an image that is indicated by the picture signal and blurring its edge. Now, the sticking phenomenon is a deterioration phenomenon of luminescence characteristics that occurs in the case where the frequency for a particular pixel of the panel 158 to become luminous is higher than those of the other pixels. The luminance of a pixel that has deteriorated of the sticking phenomenon of an image is lower than the luminance of the other pixels that have not deteriorated. Therefore, difference in luminance between a pixel which has been and the surrounding pixels which have not deteriorated becomes larger. Due to such difference in luminance, users of the display device 100 who see pictures and images displayed by the display device 100 would find the screen as if letters are sticking on it.

For example, the I/F 114 is an interface for transmitting/receiving a signal to/from elements outside the picture signal processor 110, such as the controller 104.

The linear converter 116 executes gamma adjustment on an input picture signal to adjust it to a linear picture signal. For example, if the gamma value of an input signal is "2.2," the linear converter 116 adjusts the picture signal so that its gamma value becomes "1.0."

The pattern generator 118 generates test patterns for use in image processes inside the display device 100. The test patterns for used in image processes inside the display device 100 include, for example, a test pattern which is used for display check on the panel 158, but are not limited thereto.

The colour temperature adjuster 120 adjusts the colour temperature of an image indicated by a picture signal, and adjusts colours to be displayed on the panel 158 of the display device 100. Besides, the display device 100 may include colour temperature adjusting means (not shown) by which a user who uses the display device 100 can adjust colour temperature. By the display device 100 including the colour temperature adjusting means (not shown), users can adjust the colour temperature of an image displayed on the screen. Now, examples of the colour temperature adjusting means (not shown) which the can be included in the display device include, but are not limited to, buttons, directional keys, a rotary selector, such as a Jog-dial, and any combinations thereof.

The still image detector 122 detects a chronological difference between input picture signals. And it determines that the input picture signals indicate a still image if a predetermined time difference is not detected. A detection result from the still image detector 122 may used for preventing a sticking phenomenon on the panel 158 and inhibiting deterioration of luminescence elements, for example.

The long-term colour temperature adjuster 124 adjusts aging-related changes of red (designated "R" bellow), green (designated "G" below), and blue (designated "B" below) sub-pixels included in each pixel of the panel 158. Now, respective luminescence elements (organic EL elements) for respective colours included in a sub-pixel of a pixel vary in L-T characteristics (luminance-time characteristics). Hence, with aging-related deterioration of luminescence elements, the colour balance will be lost when an image indicated by a picture signal is displayed on the panel 158. Therefore, the long-term colour temperature adjuster 124 compensates a luminescence element (organic EL element) for each colour included in a sub-pixel for its aging-related deterioration.

The luminous time controller 126 controls the luminous time for each pixel of the panel 158. More specifically, the luminous time controller 126 controls the ratio of the luminous time of a luminescence element to one frame period (or rather, the ratio of luminousness to dead screen for one frame period, which will be called a "duty" below). The display device 100 can display the image indicated by a picture signal for a predetermined time period by applying a current selectively to the pixels of the panel 158.

Also, the luminous time controller 126 may control the gain of a picture signal in correspondence to control over the luminous time. The detail configuration of the luminous time controller 126 according to an embodiment of the present invention and control over a luminous time and the gain of a picture signal in respect to the display device 100 according to an embodiment of the present invention will be described later.

The signal level adjuster 128 determines a risk degree for developing an image sticking phenomenon in order to prevent the image sticking phenomenon. And, the signal level adjuster 128 adjusts luminance of a picture to be displayed on the panel 158 by adjusting the signal level of a picture signal in order to prevent an image sticking phenomenon when the risk degree is equal to or over a predetermined value.

The long-term colour temperature adjusting detector 138 detects information for use by the long-term colour temperature adjuster 124 in compensating a luminescence element with its aging-related deterioration. The information detected by the long-term colour temperature adjusting detector 138 may be sent to the controller 104 through the I/F 114 to be recorded onto the recorder 106 via the controller 104.

The unevenness adjuster 130 adjusts the unevenness, such as horizontal stripes, vertical stripes, and spots in the whole screen, which might occur when an image or a picture indicated by a picture signal is displayed on the panel 158. For example, the unevenness adjuster 130 may perform an adjustment with reference to the level of an input signal and a coordinate position.

The gamma converter 132 executes a gamma adjustment on the picture signal into which a picture signal has been converted to have a linear characteristic by the linear converter 116 (more strictly, a picture signal output from the unevenness adjuster 130) so as to perform adjustment so that the picture signal have a predetermined gamma value. Now, such a predetermined gamma value is a value by which the V-I characteristic of a pixel circuit (to be described later) included in the panel 158 of the display device 100 (voltage-current characteristics; more strictly, the V-I characteristic of a transistor included in the picture circuit) can be cancelled. By the gamma converter 132 executing the gamma adjustment on a picture signal to give it a predetermined gamma value as described above, the relation between light amount of an object indicated by the picture signal and a current to be applied to luminescence elements can be handled linearly.

The dither processor 134 performs a dithering process on the picture signal which has been executed a gamma adjustment by the gamma converter 132. Now, the dithering is to display with displayable colours combined in order to represent medium colours in an environment where the number of available colours is small. Colours which can not be normally displayed on the panel can be seemingly represented, produced by performing dithering by the dither processor 134.

The signal output 136 outputs to the outside of the picture signal processor 110 the picture signal on which a dithering process is performed by the dither processor 134. Now, the picture signal output from the signal output 136 may be provided as a signal separately given for each colour of R, G, and B.

The gate pulse output 140 outputs a selection signal for controlling the luminousness and the luminous time of each pixel of the panel 158. Now, the selection signal is based on a duty output by the luminous time controller 126; thus, for example, luminescence elements of a pixel may be luminous when a selection signal is at a high level, and luminescence elements of a pixel may be not luminous when a selection signal is at a low level.

The gamma circuit controller 142 outputs a predetermined setting value to the gamma circuit 154 (to be described later). Now, such a predetermined setting value output from the gamma circuit controller 142 by the gamma circuit controller 142 can be a reference voltage to be given to a ladder resistance of a D/A converter (Digital-Analogue Converter) included in the data driver 152 (to be described later).

The picture signal processor 110 may execute various signal processes on an input picture signal by the configurations described above.

The memory 150 is alternative means for storing included in the display device 100. The information held in the memory 150 includes, for example, information necessary in the case where the signal level adjuster 128 adjusts luminance; the information has information on a pixel or a group of pixels which are luminous at the luminance over a predetermined luminance and corresponding information on the exceeding quantity. And, examples of the memory 150 include, but are not limited to, volatile memories, such as SDRAMs (Synchronous Dynamic Random Access Memory) and SRAMs (Static Random Access Memory). For example, the memory 150 may be a magnetic recording medium, such as a hard disk, or a non volatile memory, such as a flash memory.

When an overflowing current is generated due to, for example, a short circuit on a substrate (not shown), the overflowing current detector 156 detects the overflowing current, and informs the gate pulse output 140 of the generation of the overflowing current. For example, the gate pulse output 140 informed of the overflowing current generation by the overflowing current detector 156 may refrain from applying a selection signal to each pixel of the panel 158, so that the overflowing current is prevented from being applied to the panel 158.

The data driver 152 converts the signal output from the signal output 136 into a voltage signal to be applied to each pixel of the panel 158, and outputs the voltage signal to the panel 158. Now, the data driver 152 may include a D/A converter for converting a picture signal as a digital signal into a voltage signal as an analogue signal.

The gamma circuit 154 outputs a reference voltage to be given to a ladder resistance of the D/A converter included in the data driver 152. The reference voltage output to the data driver 152 by the gamma circuit 154 may be controlled by the gamma circuit controller 142.

The panel 158 is a display included in the display device 100. The panel 158 has a plurality of pixels arranged in a matrix pattern. Also, the panel 158 has data lines, to which a voltage signal depending on a picture signal in correspondence to each pixel is applied, and scan lines, to which a selection signal is applied. For example, the panel 158 which displays a picture at definition of SD (Standard Definition) has at least 640×480=307200 (Data Lines×Scan Lines) pixels, and if these pixels are formed out of R, G, and B sub-pixels for provide coloured display, then it has 640×480×3=921600 (Data Lines×Scan Lines×Number of Sub-Pixels) sub-pixels. Similarly, the panel 158 which displays a picture at definition of HD (High Definition) has 1920×1080 pixels, and for coloured display, it has 1920×1080×3 sub-pixels.

[Application Example of Sub-Pixels: with Organic EL Elements Included]

If the luminescence elements included in a sub-pixel of each pixel are organic EL elements, the I-L characteristics will be linear. As described above, the display device 100 can get the relation between the light amount of an object indicated by a picture signal and the current amount to be applied to the luminescence elements to be linear by the gamma adjustment by the gamma converter 132. Thus, the display device 100 can get the relation between the light amount of an object indicated by a picture signal and a luminescence amount to be linear, so that a picture and an image can be displayed accurately in accordance to the picture signal.

Also, the panel 158 includes in each pixel a pixel circuit for controlling a current amount to be applied. A pixel circuit includes a switching element and a driving element for controlling a current amount by an applied scan signal and an applied voltage signal, and also a capacitor for holding a voltage signal, for example. The switching element and the driving element are formed out of TFTs (Thin Film Transistors), for example. Now, because the transistors included in pixel circuits are different from each other in V-I characteristic, the V-I characteristic of the panel 158 as a whole is different from the V-I characteristics of the panels included in the other display devices that are configured similarly to the display device 100. Therefore, the display device 100 gets the relation between the light amount of an object indicated by a picture signal and the current amount to be applied to luminescence elements to be linear by performing a gamma adjustment in correspondence to the panel 158 by the above-described gamma converter 132 so as to cancel the V-I characteristic of the panel 158. Besides, there will be described later examples of the configuration of a pixel circuit included in the panel 158 according to an embodiment of the present invention.

The display device 100 according to an embodiment of the present invention can display a picture and an image according to an input picture signal, configured as shown in FIG. 1. Besides, although the picture signal processor 110 is shown in FIG. 1 with the linear converter 116 followed by the pattern generator 118, it is not limited to such a configuration, and a picture signal processor may have the pattern generator 118 followed by the linear converter 116.

(Outline of Changes in Signal Characteristics for Display Device 100)

Next, there will be described the outline of changes in signal characteristics in respect to the above-described display device 100 according to an embodiment of the present invention will be described. Each of FIG. 2A-FIG. 2F is an illustration that schematically shows changes in signal characteristics in respect to the display device 100 according to an embodiment of the present invention.

Figure 2A:
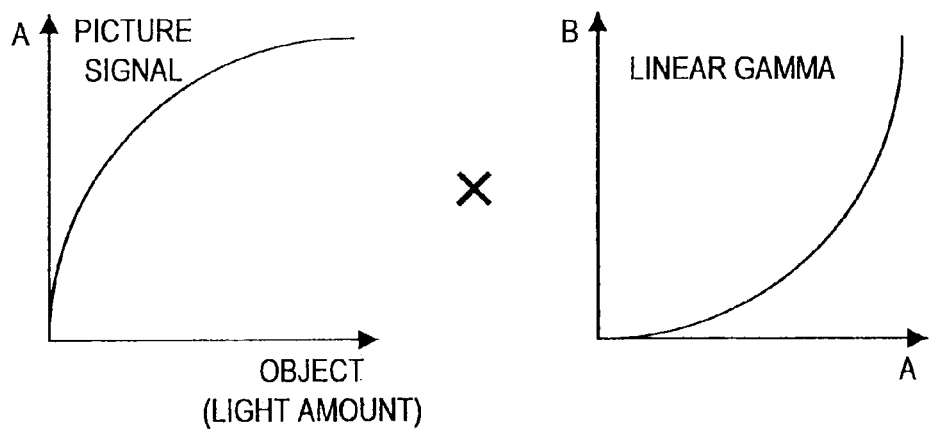
FIG. 2A is an illustration that schematically shows changes in signal characteristics in respect to a display device according to an embodiment of the present invention.
Figure 2B:
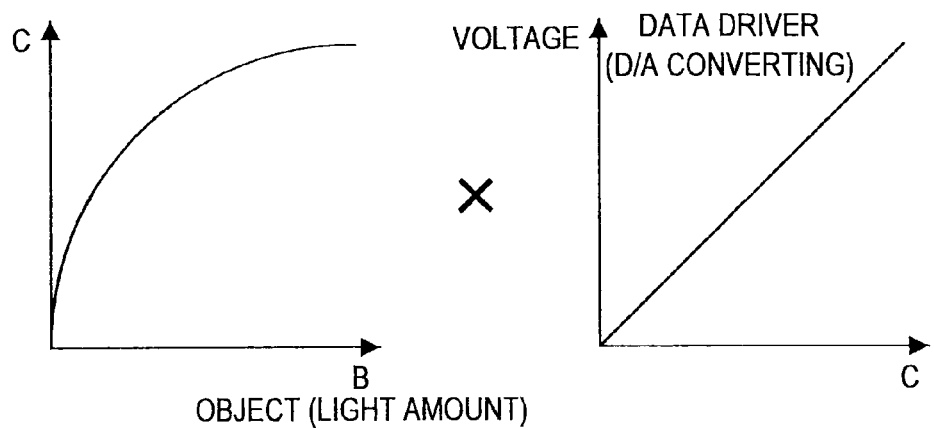
FIG. 2B is an illustration that schematically shows changes in signal characteristics in respect to a display device according to an embodiment of the present invention.

Now, each graph in FIG. 2A-FIG. 2F shows chronologically a process in the display device 100, and the left diagrams in FIG. 2B-FIG. 2E show signal characteristics as results of the respective preceding processes; for example, "the signal characteristic as a result of the process in FIG. 2A corresponds to the left diagram in FIG. 2B." The right diagrams in FIG. 2A-FIG. 2E show signal characteristics for use as coefficients in the processes.

[First Signal Characteristic Change: Change Due to Process by Linear Converter 116]

As shown in the left diagram of FIG. 2A, for example, a picture signal transmitted from a broadcasting station or the like (a picture signal input into the picture signal processor 110) has a predetermined gamma value (e.g., "2.2"). The linear converter 116 of the picture signal processor 110 adjusts it into a picture signal with a characteristic that gives a linear relation between the light amount of an object indicated by a picture signal and an output B, by multiplying the gamma curve (linear gamma: the right diagram of FIG. 2A) that is inverse to the gamma curve (the left diagram of the FIG. 2A) indicated by the picture signal input into the picture signal processor 110, so that the gamma value of the picture signal input into the picture signal processor 110 is cancelled.

[Second Signal Characteristic Change: Change Due to Process by Gamma Converter 132]

The gamma converter 132 of the picture signal processor 110 multiplies the gamma curve (panel gamma: the right diagram of the FIG. 2B) inverse to the gamma curve unique to the panel 158 in advance in order to cancel the V-I characteristic (the right diagram of the FIG. 2D) of a transistor included in the panel 158.

[Third Signal Characteristic Change: Change Due to D/A Conversion by Data Driver 152]

Figure 2C:
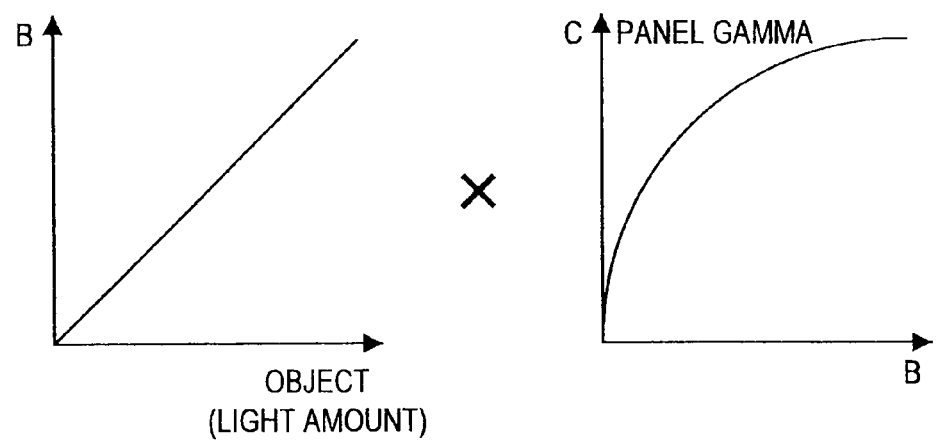
FIG. 2C is an illustration that schematically shows changes in signal characteristics in respect to a display device according to an embodiment of the present invention.

FIG. 2C shows the case where the picture signal is D/A-converted by the data driver 152. As shown in FIG. 2C, the picture signal is D/A-converted by the data driver 152, so that the relation for the picture signal between the light amount of an object indicated by the picture signal and the voltage signal into which the picture signal is D/A-converted will be as the left diagram of the FIG. 2D.

[Forth Signal Characteristic Change: Change at Pixel Circuit of Panel 158]

Figure 2D:
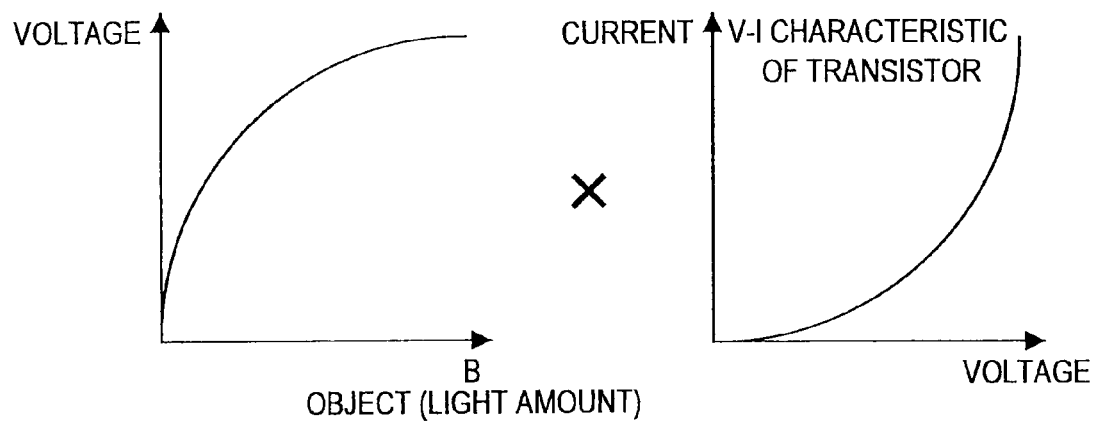
FIG. 2D is an illustration that schematically shows changes in signal characteristics in respect to a display device according to an embodiment of the present invention.

FIG. 2D shows the case where the voltage signal is applied to a pixel circuit included in the panel 158 by the data driver 152. As shown in FIG. 2B, the gamma converter 132 of the picture signal processor 110 has multiplied a panel gamma in correspondence to the V-I characteristic of a transistor included in the panel 158 in advance. Therefore, if the voltage signal is applied to the pixel circuit included in the panel 158, the relation for the picture signal between the light amount of an object indicated by the picture signal and the current to be applied to the pixel circuit will be linear as shown in the left diagram of FIG. 2E.

[Fifth Signal Characteristic Change: Change at Luminescence Element (Organic EL Element) of Panel 158]

Figure 2E:
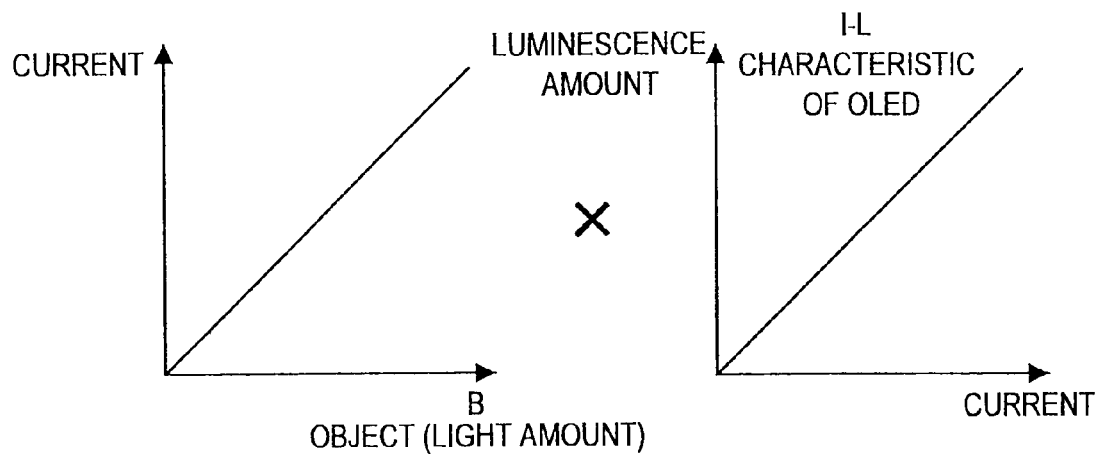
FIG. 2E is an illustration that schematically shows changes in signal characteristics in respect to a display device according to an embodiment of the present invention.
Figure 2F:
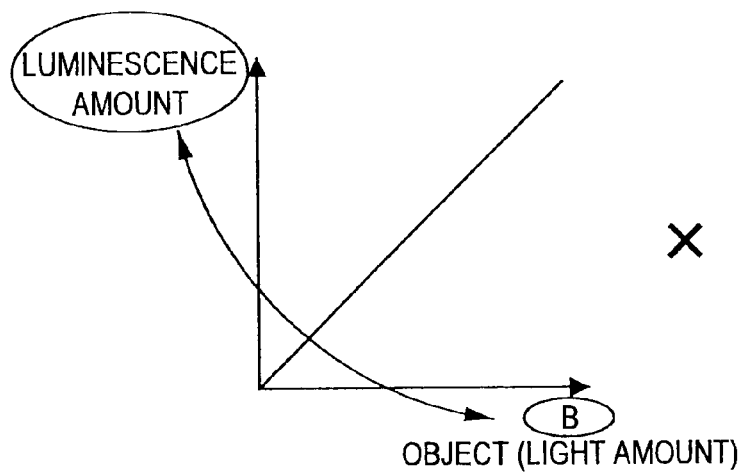
FIG. 2F is an illustration that schematically shows changes in signal characteristics in respect to a display device according to an embodiment of the present invention.

As shown in the right diagram of FIG. 2E, the I-L characteristic of an organic EL element (OLED). Therefore, at a luminescence element of the panel 158, since both of the multiplied factors have linear signal characteristics as shown in FIG. 2E, the relation for the picture signal between the light amount of an object indicated by the picture signal and the luminescence amount of the luminescence element is a linear relation (FIG. 2F).

As shown in FIG. 2A-FIG. 2F, the display device 100 may have a linear relation between the light amount of an object indicated by an input picture signal and the luminescence amount of a luminescence element. Therefore, the display device 100 can display a picture and an image accurately according to the picture signal.

(Example of Configuration of Pixel Circuit Included in Panel 158 of Display Device 100)

Next, there will be described an example of the configuration of a pixel circuit included in the panel 158 of the display device 100 according to an embodiment of the present invention. And, in the following, the explanation will be provided with assumption that the luminescence element is an organic EL element, for example.

[1] Structure of Pixel Circuit

Figure 3:
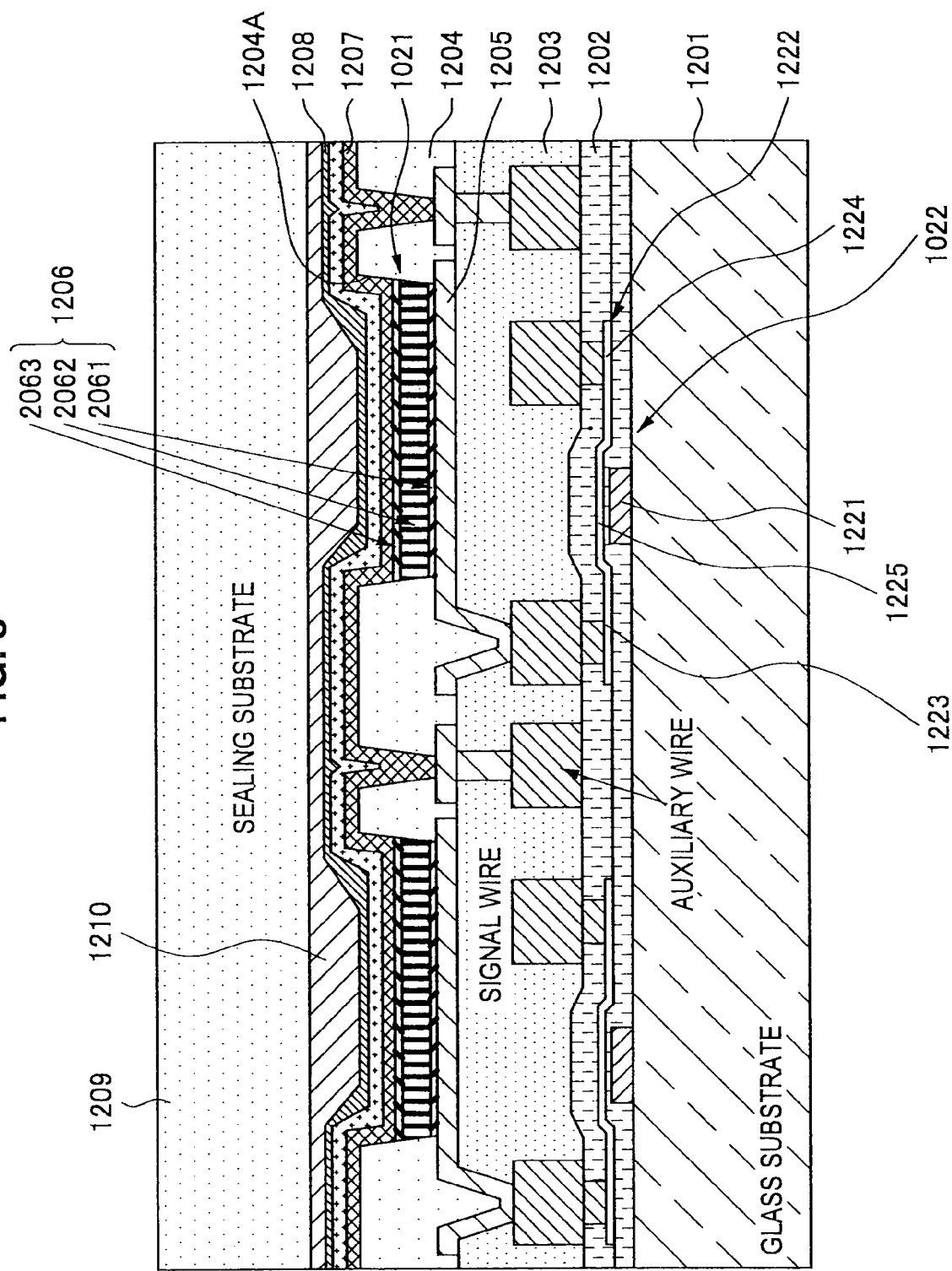
FIG. 3 is a cross-sectional diagram that shows an example of the cross-sectional structure of a pixel circuit provided for a panel of a display device according to an embodiment of the present invention.

First, the structure of a pixel circuit included in the panel 158 will be described. FIG. 3 is a cross-sectional diagram that shows an example of the cross-sectional structure of a pixel circuit provided for the panel 158 of the display device 100 according to the present invention.

With reference to FIG. 3, the pixel circuit provided for the panel 158 is configured to have a dielectric film 1202, a dielectric planarising film 1203, and a window dielectric film 1204, each of which is formed in this order on a glass substrate 1201 where a driving transistor 1022 and the like are formed, and to have organic EL elements 1021 provided for recessed parts 1204A in this window dielectric film 1204. Besides, in FIG. 3, only the driving transistor 1022 of each element of the driving circuit is depicted, and depictions for the other elements are omitted.

An organic EL element 1021 includes an anode electrode 1205 made of metals and the like formed at the bottom part of a recessed part 1204A in the above-mentioned window dielectric film 1204, and an organic layer (electron transport layer, luminescence layer, and hole transmit layer/hole inject layer) 1206 formed on this anode electrode 1205, a cathode electrode 1207 made of a transparent conductive film and the like formed on this organic layer commonly for all of the elements.

In the organic EL element 1021, the organic layer is formed by sequentially depositing a hole transmit layer/hole inject layer 2061, and a luminescence layer 2062, an electrode transport layer 2063, and an electrode inject layer (not shown) on the anode electrode 1205. Now, with a current flowing from the driving transistor 1022 to the organic layer 1206 through the anode electrode 1205, the organic EL element 1021 becomes luminous when an electron and a hole recombine at the luminescence layer 2062.

The driving transistor 1022 includes a gate electrode 1221, a source/drain area 1223 provided on one side of a semiconductor layer 1222, a drain/source area 1224 provided on the other side of the semiconductor layer 1222, a channel forming area 1225 which is a part opposite to the gate electrode 1221 of the semiconductor layer 1222. And, the source/drain area 1223 is electrically connected to the anode electrode 1205 of the organic EL element 1021 via a contact hole.

After the organic EL element 1021 has been formed on a pixel basis on the glass substrate 1201 on which the driving circuit is formed, a sealing substrate 1209 is bonded via a passivation film 1208 by adhesive 1210, and then the organic EL element 1021 is sealed by this sealing substrate 1209, thus the panel 158 is formed.

[2] Driving Circuit

Next, an example of the configuration of a driving circuit provided for the panel 158 will be described.

The driving circuit included in a pixel circuit of the panel 158 including organic EL elements could vary depending on the number of transistors and the number of capacitors, where the transistors and the capacitors are included in the driving circuit. Examples of the driving circuit includes a driving circuit including 5 transistors/1 capacitor (which may be designated below as a "5Tr/1C driving circuit"), a driving circuit including 4 transistors/1 capacitor (which may be designated below as a "4Tr/1C driving circuit"), a driving circuit including 3 transistors/1 capacitor (which may be designated below as a "3Tr/1C driving circuit"), and a driving circuit including 2 transistors/1 capacitor (which may be designated below as a "2Tr/1C driving circuit"). Then, first of all, the common matters amongst the above driving circuits will be described.

In the following, for reasons of simplicity, each transistor included in a driving circuit will be described with the assumption that it includes an n-channel type TFT. Besides, a driving circuit according to an embodiment of the present invention can, of course, include p-channel type TFTs. And, a driving circuit according to an embodiment of the present invention can be configured to have transistors formed on a semiconductor substrate or the like. In other words, the structure of a transistor included in a driving circuit according to an embodiment of the present invention is not particularly limited. And, in the following, a transistor included in a driving circuit according to an embodiment of the present invention will be described with the assumption that it is enhancement type, though it is not limited thereto; a depression type transistor may be also used. Furthermore, a transistor included in a driving circuit according to an embodiment of the present invention may be single gate type or dual gate type.

And, in the following explanation, it is assumed that the panel 158 includes (N/3)×M pixels arranged in a 2-dimension matrix pattern (M is a natural number larger than 1; N/3 is a natural number larger than 1), and that each pixel include three sub-pixels (an R luminescence sub-pixel that generates red light, a G luminescence sub-pixel that generates green light, and a B luminescence sub-pixel that emits blue light). And, luminescence elements included in each pixel are assumed to be line sequentially driven, and the display frame rate is represented by FR (frames/sec.). Now, luminescence elements included in each of (N/3) pixels arranged in the m-th row (m=1, 2, 3, . . . , M), or more specifically N sub-pixels, will be driven simultaneously. In other words, the timing for emitting light or not of each luminescence element included in one row is controlled on the basis of the row to which they belong. Now, the process for writing a picture signal onto each pixel included in one row may be a process of writing a picture signal simultaneously onto all of the pixels (which may be designated as the "simultaneous writing process"), or a process of writing a picture signal sequentially onto each pixel (which may be designated as the "sequential writing process"). Either of the writing processes is optionally chosen depending on the configuration of a driving circuit.

And, in the following, driving and operating related to the luminescence element located on the m-th row and the n-th column (n=1, 2, 3, . . . , N) will be described, where such a luminescence element is designated as the (n, m) luminescence element or the (n, m) sub-pixel.

Until a horizontal scanning period (m-th horizontal scanning period) for each luminescence element arranged in m-th row expires, various processes (the threshold voltage canceling process, the writing process, and the mobility adjusting process, each of which will be described below) are performed in the driving circuit. Now, the writing process and the mobility adjusting process are necessarily performed during the m-th horizontal scanning period, for example. And, with some types of driving circuit, the threshold voltage canceling process and the corresponding pre-process can be performed prior to the m-th horizontal scanning period.

Then, after all of the above-mentioned various processes are done, a luminescence part included in each luminescence element arranged in the m-th row is made luminous by the driving circuit. Now, the driving circuit may make the luminescence parts luminous immediately when all of the above-mentioned various processes are done, or after a predetermined period (e.g., a horizontal scanning period for the predetermined number of rows) expires. And, such periods can be optionally set, depending on the specification of a display device and the configuration of a driving circuit and the like. Besides, in the following explanation, for reasons of simplicity, luminescence parts are assumed to be made luminous immediately when various processes are done.

The luminosity of a luminescence part included in each luminescence element arranged in the m-th row is maintained, for example, until just before beginning of the horizontal scanning period of each luminescence element arranged in (m+m')-th row, where "m'" is determined according to the design specification of a display device. In other words, the luminosity of a luminescence part included in each luminescence element arranged in the m-th row in a given display frame is maintained until the (m+m'−1)-th horizontal scanning period. And, for example, from the beginning of the (m+m')-th horizontal scanning period until the writing process or the mobility adjusting process are done within the m-th horizontal scanning period in the next display frame, a luminescence part included in each luminescence element arranged in the m-th row maintains non luminous state. And, the time length of a horizontal scanning period is a time length shorter than (1/FR)×(1/M) seconds, for example. Now, if the value of (m+m') is above M, the horizontal scanning period for the extra is managed in the next display frame, for example.

By provide the above-mentioned period of non luminous state (which may be simply designated as non luminous period in the following), afterimage blur involved in active matrix driving is reduced for the display device 100, and quality of moving image can be more excellent. Besides, the luminous state/non luminous state of each sub-pixel (more strictly a luminescence element included in a sub-pixel) according to an embodiment of the present invention is not limited as such.

And, in the following, for two source/drain areas of one transistor, the term "one source/drain area" may be used in the meaning of the source/drain area on the side connected to a power source. And, the case where a transistor is in ON state means a situation that a channel is formed between source/drain areas. It does not matter here whether a current flows from one source/drain area of this transistor to another. And, the case where a transistor is in OFF state means a situation that no channel is formed between source/drain areas. And, the case where a source/drain area of a given transistor is connected to source/drain area of another transistor embraces a mode where the source/drain area of the given transistor and the source/drain area of the other transistor possess the same area. Furthermore, a source/drain area can be formed not only from conductive materials, such as polysilicon, amorphous silicon and the like, but also from metals, alloys, conductive particles, layered structure thereof, and a layer made of organic materials (conductive polymers), for example.

Furthermore, in the following, timing charts would be shown for explaining driving circuits according to an embodiment of the present invention, where lengths (time lengths) along the transverse axis indicating respective periods are typical, and they do not indicate any rate of time lengths of various periods.

[2-2] Driving Method of Driving Circuit

Figure 4:
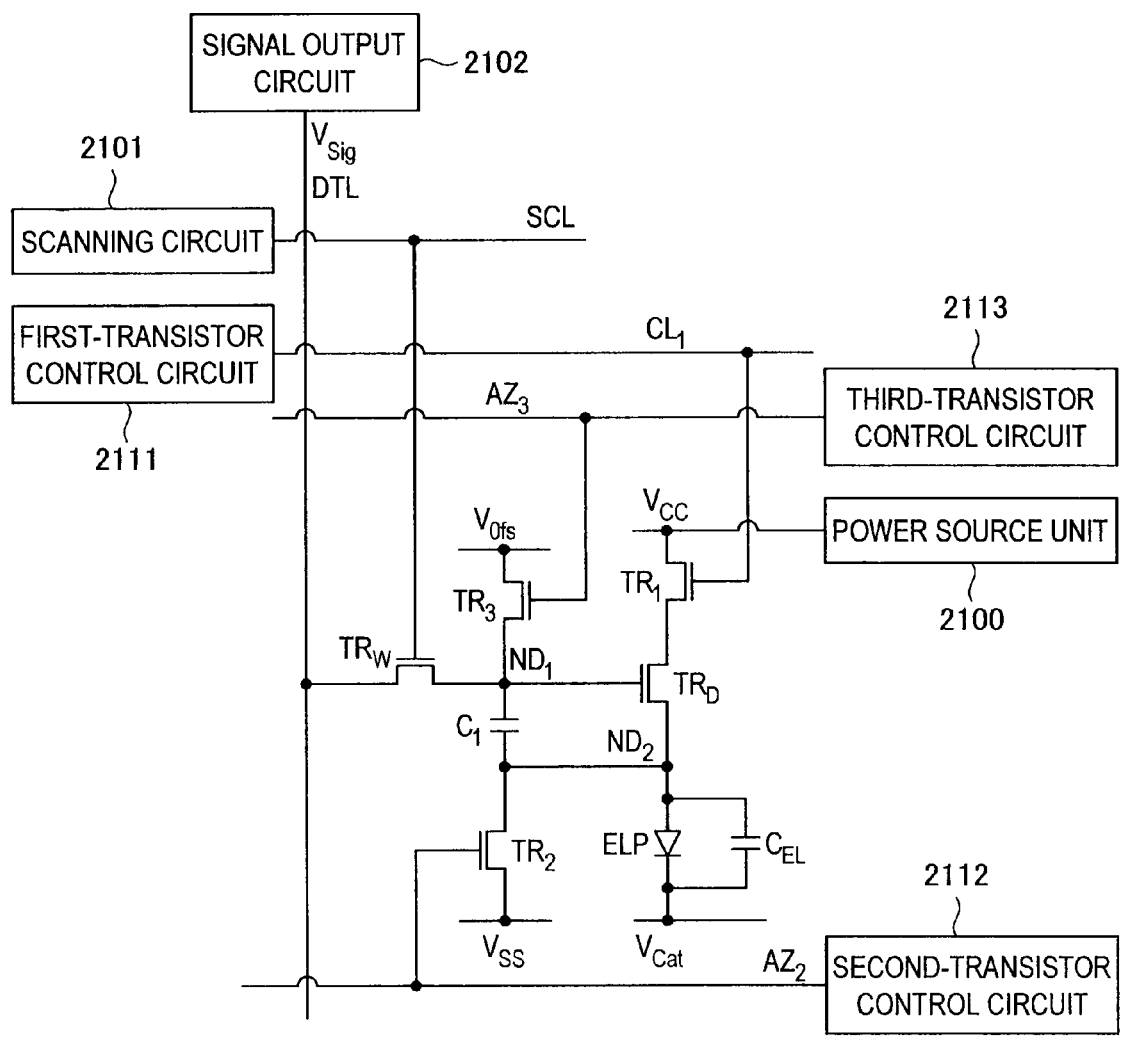
FIG. 4 is an illustration that shows an equivalent circuit for a 5Tr/1C driving circuit according to an embodiment of the present invention.

Next, a method of driving a driving circuit according to an embodiment of the present invention will be described. FIG. 4 is an illustration that shows an equivalent circuit for a 5Tr/1C driving circuit according to an embodiment of the present invention. Besides, in the following, the method of driving a driving circuit according to an embodiment of the present invention will be described with an exemplary 5Tr/1C driving circuit with reference to FIG. 4, whilst a similar driving method is basically used for the other driving circuits.

A driving circuit according to an embodiment of the present invention is driven by (a) the pre-process, (b) the threshold voltage canceling process, (c) the writing process, and (d) the luminescence process shown below, for example.

(a) Pre-Process

In the pre-process, a first-node initialising voltage is applied to the first node $ND_1$, and a second-node initialising voltage is applied to the second node $ND_2$. Now, the first-node initialising voltage and the second-node initialising voltage are applied, so that the potential difference between the first node $ND_1$ and the second node $ND_2$ is above the threshold voltage of the driving transistor $TR_D$ and the potential difference between the second node $ND_2$ and the cathode electrode included in the luminescence part ELP is not above the threshold voltage of the luminescence part ELP.

(b) Threshold Voltage Canceling Process

In the threshold voltage canceling process, the voltage of the second node $ND_2$ is changed towards a voltage obtained by subtracting the threshold voltage of the driving transistor $TR_D$ from the voltage of the first node $ND_1$, with the voltage of the first node $ND_1$ maintained.

More specifically speaking, in order to change the voltage of the first node $ND_1$ towards the voltage obtained by subtracting the threshold voltage of the driving transistor $TR_D$ from the voltage of the first node $ND_1$, a voltage which is above a voltage obtained by adding the threshold voltage of the driving transistor $TR_D$ to the voltage of the second node $ND_2$ in the process of (a) is applied to one source/drain area of the driving transistor $TR_D$. Now, in the threshold voltage canceling process, how close the potential difference between the first node $ND_1$ and the second node $ND_2$ (i.e., the potential difference the gate electrode and the source area of the driving transistor $TR_D$) approaches to the threshold voltage of the driving transistor $TR_D$ depends qualitatively on time for the threshold voltage canceling process. Therefore, as in a mode where enough long time is secured for the threshold voltage canceling process, the voltage of the second node $ND_2$ reaches at the voltage obtained by subtracting the threshold voltage of the driving transistor $TR_D$ from the voltage of the first node $ND_1$, and the driving transistor $TR_D$ gets in OFF state. On the other hand, as in a mode where there is no choice but to set the time for the threshold voltage canceling process short, the potential difference between the first node ND1 and the second node ND2 may be larger than the threshold voltage of the driving transistor TRD, and the driving transistor TRD may be not get in OFF state. Hence, in the threshold voltage canceling process, the driving transistor TRD does not necessarily get in OFF state as a result of the threshold voltage canceling process, (c) Writing Process In the writing process, a picture signal is applied to the first node $ND_1$ from the data line DTL via the writing transistor $TR_W$ that is made to be in ON state by a signal from the scan line SCL.

(d) Luminescence Process

In the Luminescence Process, the luminescence part ELP become luminous (is driven) by making the writing transistor $TR_W$ to be in OFF state by a signal from the scan line SCL to make the first node $ND_1$ to be in floating state and running a current depending on the value of the potential difference between the first node $ND_1$ and the second node $ND_2$ from the power source unit 2100 to the luminescence part ELP via the driving transistor $TR_D$.

A driving circuit according to an embodiment of the present invention is driven by the above processes of (a)-(d), for example.

[2-3] Examples of Configuration of Driving Circuit and Specific Examples of Driving Method Next, for each driving circuit, examples of the configurations of the driving circuits and a method of driving such driving circuits will be described specifically below. Besides, in the following, a 5Tr/1C driving circuit and a 2Tr/1C driving circuit out of various driving circuits will be described.

[2-3-1] 5Tr/1C Driving Circuit

Figure 5:
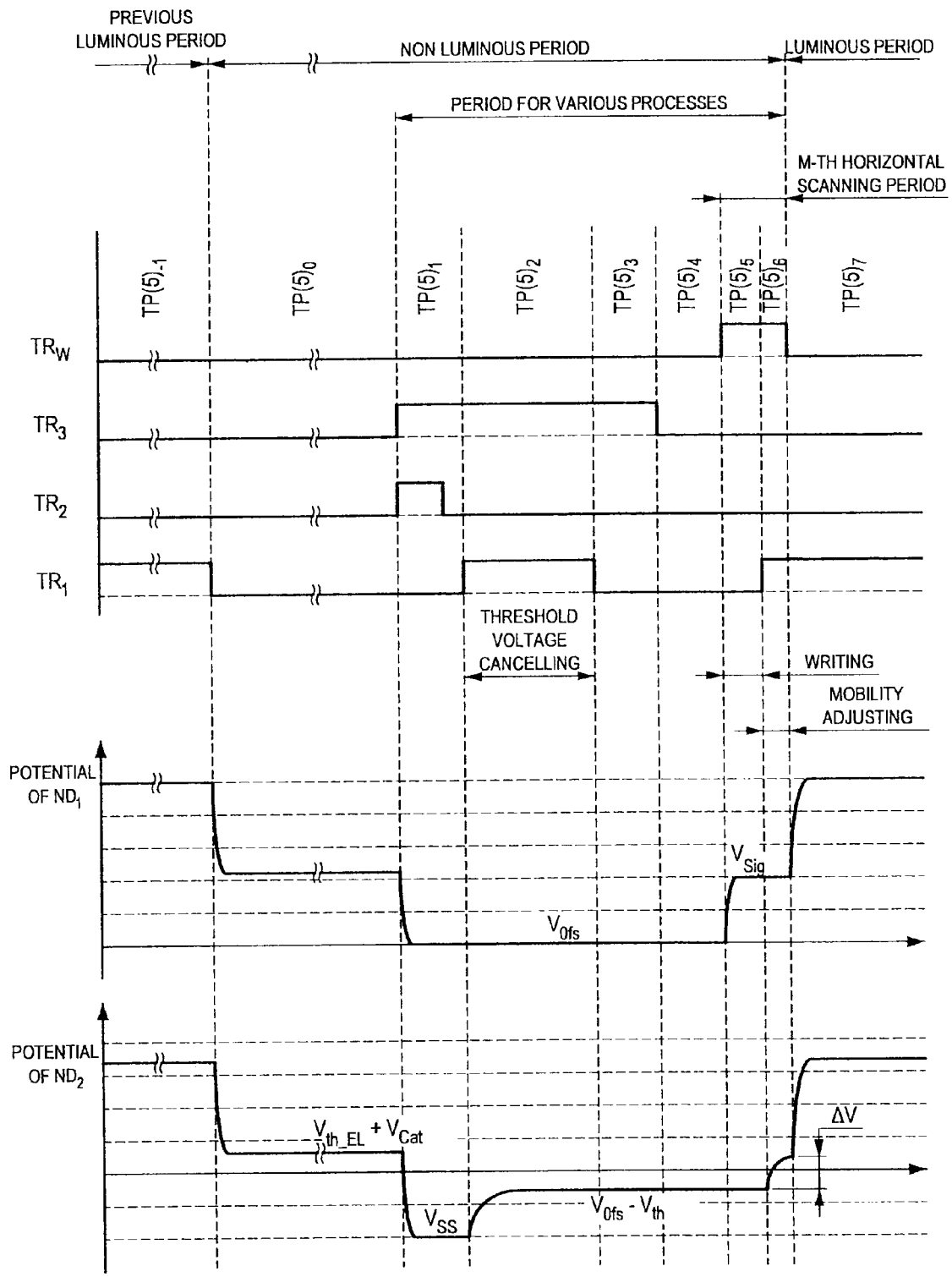
FIG. 5 is a timing chart for driving of the 5Tr/1C driving circuit according to an embodiment of the present invention.

First, a 5Tr/1C driving circuit will be described with reference to FIG. 4-FIG. 6I. FIG. 5 is a timing chart for driving of the 5Tr/1C driving circuit according to an embodiment of the present invention. FIG. 6A-FIG. 6I are illustrations that typically show respective ON/OFF states of the transistors included in the 5Tr/1C driving circuit according to an embodiment of the present invention shown in FIG. 4, etc.

With reference to FIG. 4, the 5Tr/1C driving circuit includes a writing transistor $TR_W$, a driving transistor $TR_D$, a first transistor $TR_1$, a second transistor $TR_2$, a third transistor $TR_3$, and a capacitor $C_1$; namely, the 5Tr/1C driving circuit includes five transistors and one capacitor. Besides, in the example shown in FIG. 4, the writing transistor $TR_W$, the first transistor $TR_1$, the second transistor $TR_2$, and the third transistor $TR_3$ are formed out of n-channel type TFTs, though they are not limited thereto; they may also be formed out of p-channel type TFTs. And, the capacitor $C_1$ may be formed out of a capacitor with a predetermined capacitance.

<First Transistor $TR_1$>

One source/drain area of the first transistor $TR_1$ is connected to a power source unit 2100 (voltage $V_{cc}$), and the other source/drain area of the first transistor $TR_1$ is connected to one source/drain area of the driving transistor $TR_D$. And, the ON/OFF operation of the first transistor $TR_1$ is controlled by a first-transistor control line $CL_1$, which is extended from a first-transistor control circuit 2111 to connect to the gate electrode of the first transistor $TR_1$. Now, the power source unit 2100 is provided for supply a current to a luminescence part ELP to make the luminescence part ELP luminous.

<Driving Transistor $TR_D$>

One source/drain area of the driving transistor $TR_D$ is connected to the other source/drain area of the first transistor $TR_1$. And, the other source/drain area of the driving transistor $TR_D$ is connected to the anode electrode of the luminescence part ELP, the other source/drain area of the second transistor $TR_2$, and one source/drain area of the capacitor $C_1$, and forms a second node $ND_2$. And, the gate electrode of the driving transistor $TR_D$ is connected to the other source/drain area of the writing transistor $TR_W$, the other source/drain area of the third transistor $TR_3$, and the other electrode of the capacitor $C_1$, and forms a first node $ND_1$.

Now, in the case of the luminous state of a luminescence element, the driving transistor $TR_D$ is driven to flow a drain current $I_{ds}$ according to Equation 1 below, for example, where "μ" shown in Equation 1 denotes a "effective mobility," and "L" denotes a "channel length." And similarly, "W" shown in Equation 1 denotes a "channel width," "$V_{gs}$" denotes the "potential difference between the gate electrode and the source area, "$V_{th}$" denotes a "threshold voltage," "$C_{ox}$" denotes "(Relative Permittivity of Gate Dielectric Layer)× (Permittivity of Vacuum)/(Thickness of Gate Dielectric Layer)," and "k" denotes "k≡(½)·(W/L)·$C_{ox}$," respectively.

$$I_{ds}=k\cdot\mu\cdot(V_{gs}-V_{th})^2 \qquad \text{Equation 1}$$

And, in the case of the luminous state of a luminescence element, one source/drain area of the driving transistor $TR_D$ works as a drain area, and the other source/drain area works as a source area. Besides, in the following, for the reason of simplicity of explanation, in the following explanation, one source/drain area of the driving transistor $TR_D$ may be simply designated as the "drain area", and the other source/drain area may be simply designated as the "source area".

The luminescence part ELP becomes luminous due to the drain current $I_{ds}$ shown in Equation 1 flowing thereto, for example. Now, the luminescence state (luminance) of the luminescence part ELP is controlled depending on the magnitude of the value of the drain current $I_{ds}$.

<Writing Transistor $TR_W$>

The other source/drain area of the writing transistor $TR_W$ is connected to the gate electrode of the driving transistor $TR_D$. And, one source/drain area of the writing transistor $TR_D$ is connected a data line DTL, which is extended from a signal output circuit 2102. Then, a picture signal $V_{Sig}$ for controlling the luminance of the luminescence part ELP is supplied to the one source/drain area via the data line DTL. Besides, various signals and voltages (signals for pre-charge driving, various reference voltages, etc.) except for the picture signal $V_{Sig}$ may be supplied to the one source/drain area via the data line DTL. And, the ON/OFF operation of the writing transistor $TR_W$ is controlled by a scan line SCL, which is extended from a scanning circuit 2101 to connect to the gate electrode of the writing transistor $TR_W$.

<Second Transistor $TR_2$>

The other source/drain area of the second transistor $TR_2$ is connected to the source area of the driving transistor $TR_D$. And, a voltage $V_{SS}$ for initialising the potential of the second node $ND_2$ (i.e., the potential of the source area of the driving transistor $TR_D$) is supplied to one source/drain area of the second transistor $TR_2$. And, the ON/OFF operation of the second transistor $TR_2$ is controlled by a second-transistor control line $AZ_2$, which is extended from a second-transistor control circuit 2112 to connect to the gate electrode of the second transistor $TR_2$.

<Third Transistor $TR_3$>

The other source/drain area of the third transistor $TR_3$ is connected to the gate electrode of the driving transistor $TR_D$. And, a voltage $V_{Ofs}$ for initialising the potential of the first node $ND_1$ (i.e., the potential of the gate electrode of the driving transistor $TR_D$) is supplied to one source/drain area of the third transistor $TR_3$. And, the ON/OFF operation of the third transistor $TR_3$ is controlled by a third-transistor control line $AZ_3$, which is extended from a third-transistor control circuit 2113 to connect to the gate electrode of the third transistor $TR_3$.

<Luminescence Part ELP>

The anode electrode of the luminescence part ELP is connected to the source area of the driving transistor $TR_D$. And, a voltage $V_{Cat}$ is applied to the cathode electrode of the luminescence part ELP. In FIG. 4, the capacitance of the luminescence part ELP is represented by a symbol: $C_{EL}$. And, a threshold voltage which is necessary for the luminescence part ELP to be luminous is represented by $V_{th\text{-}EL}$. Then, when voltage equal to or more than $V_{th\text{-}EL}$, is applied between the anode and cathode electrodes of the luminescence part ELP, the luminescence part ELP becomes luminous.

Besides, in the following, "$V_{Sig}$" represents a picture signal for controlling luminance of the luminescence part ELP, "$V_{CC}$" represents the voltage of the power source unit 2100, and "$V_{Ofs}$" represents the voltage for initialising the potential of the gate electrode of the driving transistor $TR_D$ (the potential of the first node $ND_1$). And, in the following, "$V_{SS}$" represents the voltage for initialising the potential of the source area of the driving transistor $TR_D$ (the potential of the second node $ND_2$), "$V_{th}$" represents a threshold voltage of the driving transistor $TR_D$, "$V_{Cat}$" represents the voltage applied to the cathode electrode of the luminescence part ELP, and "$V_{th\text{-}EL}$" represents a threshold voltage of the luminescence part ELP. Furthermore, in the following, the respective values of voltages or potentials are explained, given as follows for example, though respective values of voltages or potentials according to an embodiment of the present invention are not limited as follows, of course.

$V_{Sig}$: 0 [volt]-10 [volt]
$V_{CC}$: 20 [volt]
$V_{Ofs}$: 0 [volt]
$V_{SS}$: −10 [volt]
$V_{th}$: 3 [volt]
$V_{Cat}$: 0 [volt]
$V_{th\text{-}EL}$: 3 [volt]

In the following, with reference to FIG. 5 and FIG. 6A-FIG. 6I, the operation of a 5Tr/1C driving transistor will be described. Besides, in the following, the explanation will be provided with the assumption that luminous state starts immediately after all of the above-described various processes (the threshold voltage canceling process, the writing process, the mobility adjusting process) are done in the 5Tr/1C driving transistor, though it is not limited thereto. The explanations of 4Tr/1C driving circuit, 3Tr/1C driving circuit, and 2Tr/1C driving circuit are similarly provided below.

Figure 6A:
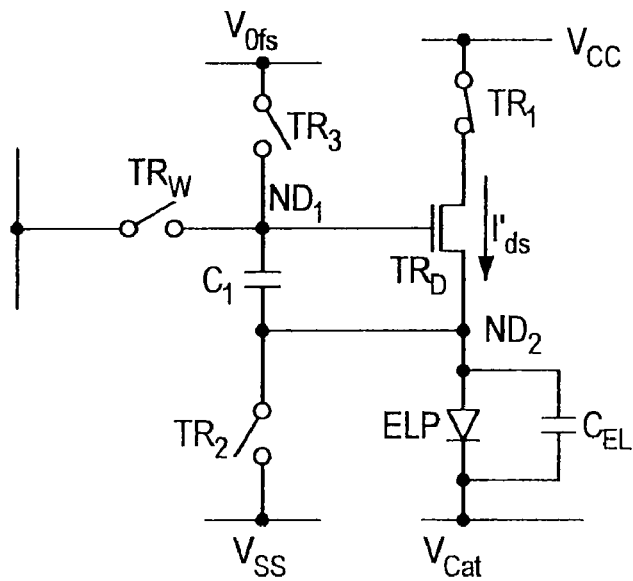
FIG. 6A is an illustration that typically shows ON/OFF state of each of the transistors included in the 5Tr/1C driving circuit according to an embodiment of the present invention, etc.

<A-1>[Period-TP($5$)$_{-1}$] (See FIG. 5 and FIG. 6A)

[Period-TP($5$)$_{-1}$] indicates, for example, an operation in the previous display frame, and is a period for which the (n, m) luminescence element is in luminous state after the last various processes are done. Thus, a drain current I' based on the equation (5) below flows into a luminescence part ELP of a luminescence element included in the (n, m) sub-pixel, and the luminance of the luminescence element included in the (n, m) sub-pixel is a value depending on this drain current I'. Here, the writing transistor $TR_W$, the second transistor $TR_2$, and the third transistor $TR_3$ are in OFF state, and the first transistor $TR_1$ and the driving transistor $TR_D$ are in ON state. The luminous state of the (n, m) luminescence element is maintained until just before the beginning of the horizontal scanning period for a luminescence element arranged in the (m+m')-th row.

[Period-TP($5$)$_0$]-[Period-TP($5$)$_4$] are operation periods laid after the luminous state after completion of the last various processes ends, and just before the next writing process is executed. In other words, these [Period-TP($5$)$_0$]-[Period-TP($5$)$_4$] corresponds to the period of a particular time length from the beginning of the (m+m')-th horizontal scanning period in the previous display frame to the end of the (m−1)-th horizontal scanning period in the current display frame. Besides, [Period-TP($5$)$_0$]-[Period-TP($5$)$_4$] may be configured to be included within the m-th horizontal scanning period in the current display frame.

And, for [Period-TP($5$)$_0$]-[Period-TP($5$)$_4$], the (n, m) luminescence element is basically in non luminous state. In other words, for [Period-TP($5$)$_0$]-[Period-TP($5$)$_1$] and [Period-TP($5$)$_3$]-[Period-TP($5$)$_4$], the luminescence element does not emit light since the first transistor $TR_1$ is in OFF state. Now, for [Period-TP($5$)$_2$], the first transistor $TR_1$ is in ON state. However, the threshold voltage canceling process to be described below is executed for [Period-TP($5$)$_2$]. Therefore, given that Equation 2 below is satisfied, the luminescence element will not be luminous.

In the following, each period of [Period-TP($5$)$_0$]-[Period-TP($5$)$_4$] will be described. Besides, the beginning of [Period-TP($5$)$_1$], and the length of each period of [Period-TP($5$)$_0$]-[Period-TP($5$)$_4$] are optionally set according the settings of the display device 100.

<A-2>[Period-TP($5$)$_0$]

As described above, for [Period-TP($5$)$_0$], the (n, m) luminescence element is in non luminous state. And, the writing transistor $TR_W$, the second transistor $TR_2$, and the third transistor $TR_3$ are in OFF state. Now, because the first transistor $TR_1$ gets into OFF state at the time point for transition from [Period-TP($5$)$_{-1}$] to [Period-TP($5$)$_0$], the potential of the second node $ND_2$ (the source area of the driving transistor $TR_D$ or the anode electrode of the luminescence part ELP) is lowered to ($V_{th\text{-}EL}+V_{Cat}$), and the luminescence part ELP gets into non luminous state. And, as the potential of the second node $ND_2$ gets lower, the potential of the first node $ND_1$ in floating state (the gate electrode of the driving transistor $TR_D$) is also lowered.

Figure 6B:
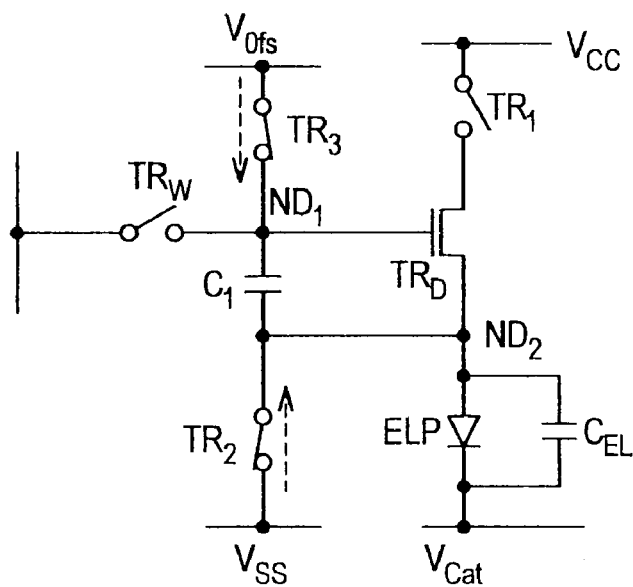
FIG. 6B is an illustration that typically shows ON/OFF state of each of the transistors included in the 5Tr/1C driving circuit according to an embodiment of the present invention, etc.
Figure 6C:
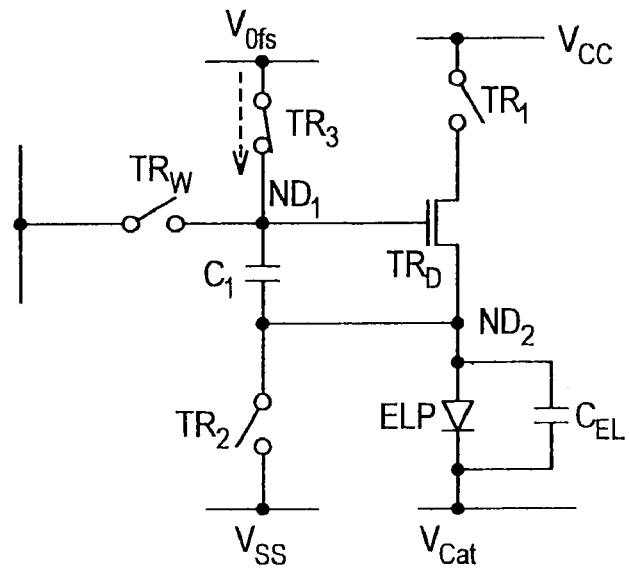
FIG. 6C is an illustration that typically shows ON/OFF state of each of the transistors included in the 5Tr/1C driving circuit according to an embodiment of the present invention, etc.

<A-3>[Period-TP($5$)$_1$] (See FIG. 5, FIG. 6B and FIG. 6C)

For [Period-TP($5$)$_1$], there is executed a pre-process for executing the threshold voltage canceling process. More specifically, at the beginning of [Period-TP($5$)$_1$], the second transistor $TR_2$ and the third transistor $TR_3$ are got into ON state by getting the second-transistor control line $AZ_2$ and the third-transistor control line $AZ_3$ to be at high level. As a result, the potential of the first node $ND_1$ becomes $V_{Ofs}$ (e.g., 0 [volt]), and the potential of the second node $ND_2$ becomes $V_{SS}$ (e.g., −10 [volt]). Then, before the expiration of [Period-TP($5$)$_1$], the second transistor $TR_2$ is got into OFF state by getting the second-transistor control line $AZ_2$ to be at low level. Now, the second transistor $TR_2$ and the third transistor $TR_3$ may be synchronously got into ON state, though they are not limited as such; for example, the second transistor $TR_2$ may be first got into ON state, or the third transistor $TR_3$ may be first got into ON state.

By the process above, the potential between the gate electrode and source area of the driving transistor $TR_D$ becomes above $V_{th}$. Now, the driving transistor $TR_D$ is in ON state.

Figure 6D:
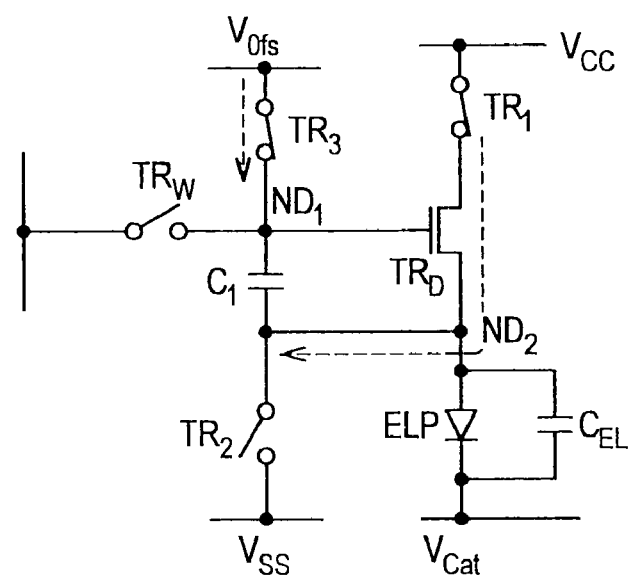
FIG. 6D is an illustration that typically shows ON/OFF state of each of the transistors included in the 5Tr/1C driving circuit according to an embodiment of the present invention, etc.

<A-4>[Period-TP(5)$_2$] (See FIG. 5 and FIG. 6D)

For [Period-TP(5)$_2$], the threshold voltage canceling process is executed. More specifically, the first transistor $TR_1$ is got into ON state by getting the first-transistor control line $CL_1$ to be at high level with the third transistor $TR_3$ maintained in ON state. As a result, the potential of the first node $ND_1$ does not change ($V_{Ofs}$=0 [volt] maintained), whilst the potential of the second node $ND_2$ changes towards the potential obtained by subtracting the threshold voltage $V_{th}$ of the driving transistor $TR_D$ from the potential of the first node $ND_1$. In other words, the potential of the second node $ND_2$ in floating state increases. Then, when the potential difference between the gate electrode and source area of the driving transistor $TR_D$ reaches to $V_{th}$, the driving transistor $TR_D$ gets into OFF state. Specifically, the potential of the second node $ND_2$ in floating state approaches to ($V_{Ofs}-V_{th}$= −3 [volt]>$V_{SS}$) to be ($V_{Ofs}-V_{th}$) in the end. Now, if Equation 2 below is assured, in other words, if the potentials are selected and determined to satisfy Equation 2, the luminescence part ELP will not be luminous.

$$(V_{Ofs}-V_{th}) < (V_{th\text{-}EL}+V_{Cat}) \qquad \text{Equation 2}$$

For [Period-TP(5)$_5$], the potential of the second node $ND_2$ will be ($V_{Ofs}-V_{th}$) eventually. Now, the potential of the second node $ND_2$ is determined, depending on the threshold voltage $V_{th}$ of the driving transistor $TR_D$, and on the potential $V_{Ofs}$ for initialising the gate electrode of the driving transistor $TR_D$; namely the potential of the second node $ND_2$ does not depend on the threshold voltage $V_{th\text{-}EL}$ of the luminescence part ELP.

Figure 6E:
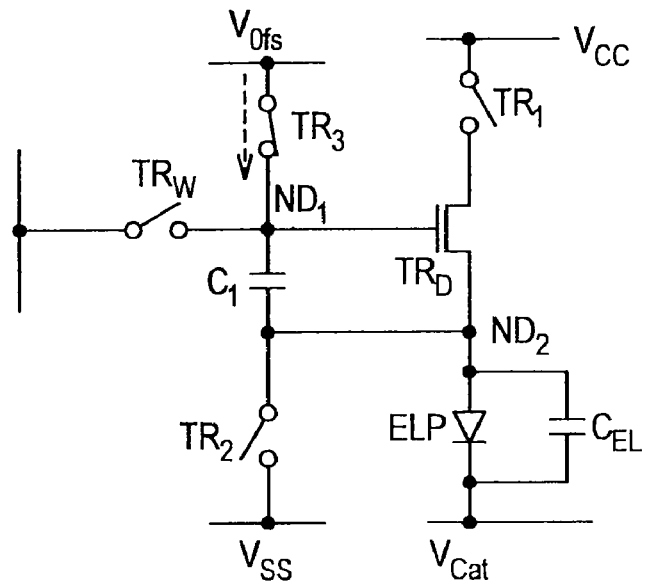
FIG. 6E is an illustration that typically shows ON/OFF state of each of the transistors included in the 5Tr/1C driving circuit according to an embodiment of the present invention, etc.

<A-5>[Period-TP(5)$_3$] (See FIG. 5 and FIG. 6E)

For [Period-TP(5)$_3$], the first transistor $TR_1$ is got into OFF state by getting the first-transistor control line $CL_1$ to be at low level with the third transistor $TR_3$ maintained in ON state. As a result, the potential of the first node $ND_1$ does not change ($V_{Ofs}$=0 [volt] maintained), nor the potential of the second node $ND_2$ does not change. Therefore, the potential of the second node $ND_2$ is maintained ($V_{Ofs}-V_{th}$=−3 [volt]).

Figure 6F:
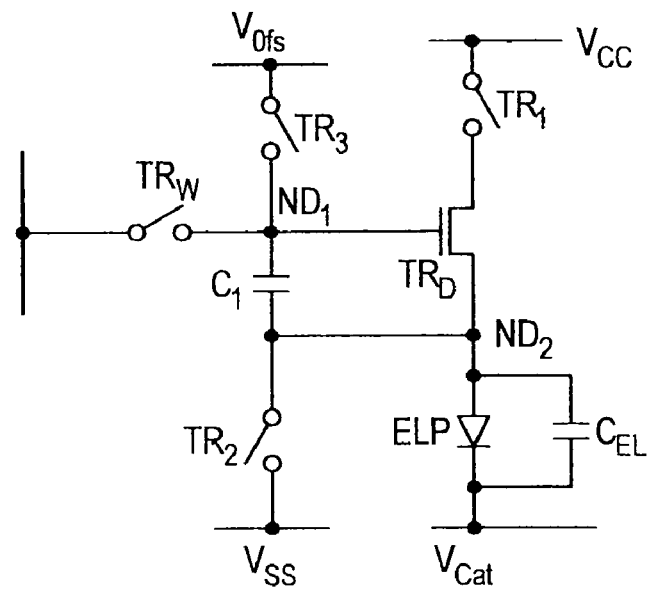
FIG. 6F is an illustration that typically shows ON/OFF state of each of the transistors included in the 5Tr/1C driving circuit according to an embodiment of the present invention, etc.

<A-6>[Period-TP(5)$_4$] (See FIG. 5 and FIG. 6F)

For [Period-TP(5)$_4$], the third transistor $TR_3$ is got into OFF state by getting the third-transistor control line $AZ_3$ to be at low level. Now, the potentials of the first node $ND_2$ and the second node $ND_2$ do not change substantially. Besides, in practice, potential changes might occur by electrostatic bonding of parasitic capacitances or the like; however, these can be normally neglected.

For [Period-TP(5)$_0$]-[Period-TP(5)$_4$], a 5Tr/1C driving transistor operates as described above. Next, each period of [Period-TP(5)$_5$]-[Period-TP(5)$_7$] will be described. Now, the writing process is executed for [Period-TP(5)$_5$], and the mobility adjusting process is executed for [Period-TP(5)$_6$]. The above-mentioned processes are necessarily executed within the m-th horizontal scanning period, for example. In the following, for the reason of simplicity of the explanation, the explanation will be provided with the assumption that the beginning of [Period-TP(5)$_5$] and the end of [Period-TP(5)$_6$] match the beginning and end of the m-th horizontal scanning period, respectively.

Figure 6G:
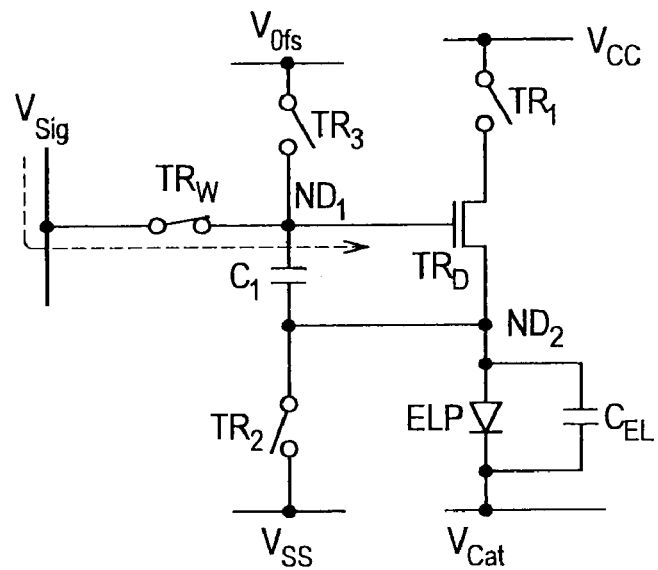
FIG. 6G is an illustration that typically shows ON/OFF state of each of the transistors included in the 5Tr/1C driving circuit according to an embodiment of the present invention, etc.

<A-7>[Period-TP(5)$_5$] (See FIG. 5 and FIG. 6G)

For [Period-TP(5)$_5$], the writing process for the driving transistor $TR_D$ is executed. Specifically, the data line DTL is made to be $V_{Sig}$ for controlling the luminance of the luminescence part ELP with the first transistor $TR_1$, the second transistor $TR_2$, and the third transistor $TR_3$ maintained in OFF state; next, the writing transistor $TR_W$ is got into ON state by getting the scan line SCL to be at high level. As a result, the potential of the first node $ND_1$ increases to $V_{Sig}$.

Now, the value of the capacitance of the capacitor $C_1$ is represented by $c_1$, the value of the capacitance of the capacitance $C_{EL}$, of the luminescence part ELP is represented by $c_{EL}$, and the value of the parasitic capacitance between the gate electrode and source area of the driving transistor $TR_D$ is represented by $c_{gs}$. When the potential of the gate electrode of the driving transistor $TR_D$ changes from $V_{Ofs}$ to $V_{Sig}$ (>$V_{Ofs}$), the potentials of both sides of the capacitor $C_1$ (the potentials of the first node $ND_1$ and the second node $ND_2$) basically change. In other words, potentials based on the change ($V_{Sig}-V_{Ofs}$) of the potential of the gate electrode of the driving transistor $TR_D$ (=the potential of the first node $ND_1$) are allotted to the capacitor $C_1$, the capacitance $C_{EL}$ of the luminescence part ELP, and the parasitic capacitance between the gate electrode and source area of the driving transistor $TR_D$. Thus, if the value $C_{EL}$ is enough larger than the value $c_1$ and the value $c_{gs}$, the change of the potential of the source area of the driving transistor $TR_D$ (the second node $ND_2$) based on the change ($V_{Sig}-V_{Ofs}$) of the potential of the driving transistor $TR_D$ is small. Now, in general, the capacitance value $c_{EL}$ of the capacitance $C_{EL}$, of the luminescence part ELP is larger than the capacitance value $c_1$ of the capacitor $C_1$ and the value $c_{gs}$ of the parasitic capacitance of the driving transistor $TR_D$. Thus, in the following, for the reason of simplicity of the explanation, the explanation will be provided, except for the cases in particular necessities, without any regard to potential changes of the second node $ND_2$ which occur by potential changes of the first node $ND_1$. It is the same as described above for the other driving circuits shown below. And, FIG. 5 is shown without any regard to potential changes of the second node $ND_2$ which occur by potential changes of the first node $ND_1$.

And, the value of $V_g$ is as "$V_g=V_{Sig}$" and the value of $V_s$ is as "$V_s \approx V_{Ofs}-V_{th}$", where $V_g$ is the potential of the gate electrode of the driving transistor $TR_D$ (the first node $ND_1$) and $V_s$ is the potential of the source area of the driving transistor $TR_D$ (the second node $ND_2$). Therefore, the potential difference between the first node $ND_1$ and the second node $ND_2$, namely the potential difference $V_{gs}$ between the gate electrode and source area of the driving transistor $TR_D$ can be expressed by Equation 3 below.

$$V_{gs} \approx V_{Sig}-(V_{Ofs}-V_{th}) \qquad \text{Equation 3}$$

As shown in Equation 3, $V_{gs}$ obtained in the writing process for the driving transistor $TR_D$ depends on only the picture signal $V_{Sig}$ for controlling the luminance of the luminescence part ELP, the threshold voltage $V_{th}$ of the driving transistor $TR_D$, and the voltage $V_{Ofs}$ for initialising the gate electrode of the driving transistor $TR_D$. And it can be seen from Equation 3 that $V_{gs}$ obtained in the writing process for the driving transistor $TR_D$ does not depend on the threshold voltage $V_{th\text{-}EL}$ of the luminescence part ELP.

Figure 6H:
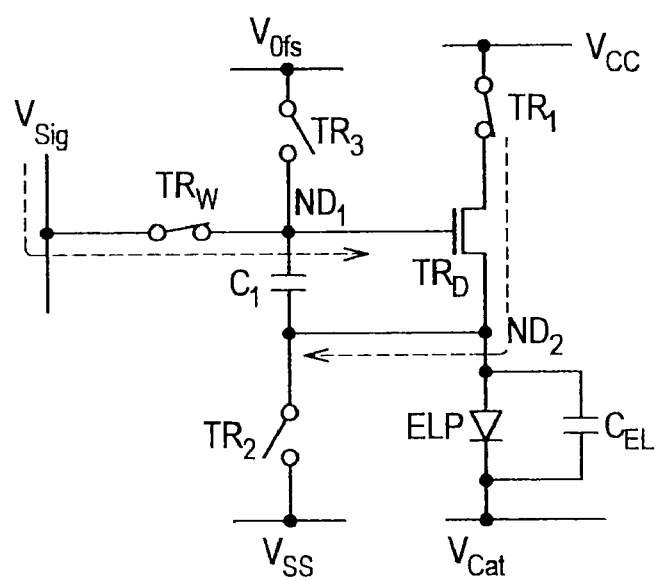
FIG. 6H is an illustration that typically shows ON/OFF state of each of the transistors included in the 5Tr/1C driving circuit according to an embodiment of the present invention, etc.

<A-8>[Period-TP(5)$_6$] (See FIG. 5 FIG. 6H)

For [Period-TP(5)$_6$], an adjustment (mobility adjustment process) on the potential of the source area of the driving transistor $TR_D$ (the second node $ND_2$) based on the magnitude of the mobility µ of the driving transistor $TR_D$ is executed.

In general, if the driving transistor $TR_D$ is made of a polysilicon film transistor or the like, it is hard to avoid that the mobility µ varies amongst transistors. Therefore, even if picture signals $V_{Sig}$s of the same value are applied to gate electrodes of a plurality of driving transistors $TR_D$s of different mobility µs, there might be found a difference between a drain current $I_{ds}$ flowing a driving transistor $TR_D$ with large mobility µ and a drain $I_{ds}$ flowing a driving transistor $TR_D$ with small mobility μ. Then, if such a difference occurs, the uniformity of the screen of the display device 100 will be lost.

Then, for [Period-TP(5)$_6$], the mobility adjusting process is executed in order to prevent the issues described above from occurring. Specifically, the first transistor TR$_1$ is got into ON state by getting the first transistor control line CL$_1$ to be at high level with the writing transistor TR$_W$ maintained in ON state; next, by getting the first transistor control line CL$_1$ to be at high level after a predetermined time (t$_0$) has passed, the first transistor TR$_1$ is got into ON state, and next, by getting the scan line SCL to be at low level after a predetermined time (t$_0$) has passed, the writing transistor TR$_W$ is got into OFF state, and the first node ND$_1$ (the gate electrode of the driving transistor TR$_D$) is got into floating state. As a result, if the value of the mobility μ of the driving transistor TR$_D$ is large, then the increased amount ΔV (potential adjustment value) of the potential of the source area of the driving transistor TR$_D$ is large, and if the value of the mobility μ of the driving transistor TR$_D$ is small, then the increased amount ΔV (potential adjustment value) of the potential of the source area of the driving transistor TR$_D$ is small. Now, the potential difference V$_{gs}$ between the gate electrode and source area of the driving transistor TR$_D$ is transformed, for example, as Equation 4 below, based on Equation 3.

$$V_{gs} \approx V_{Sig} - (V_{Ofs} - V_{th}) - \Delta V \qquad \text{Equation 4}$$

Besides, the predetermined time for executing the mobility adjusting process (the total time t$_0$ of [Period-TP(5)$_6$]) can be determined in advance as a configuration value during the configuration of the display device 100. And, the total time t$_0$ of [Period-TP(5)$_6$] can be determined so that the potential of the source area of the driving transistor TR$_D$ in this case (V$_{Ofs}$-V$_{th}$+ΔV) satisfy Equation 5 below. In such a case, the luminescence part ELP will not be luminous for [Period-TP(5)$_6$]. Moreover, an adjustment on the variation of the coefficient k ($\equiv$(½)·(W/L)·C$_{ox}$) is also executed simultaneously by this mobility adjusting process.

$$V_{Ofs} - V_{th} + \Delta V < (V_{th-EL} + V_{Cat}) \qquad \text{Equation 5}$$

Figure 6I:
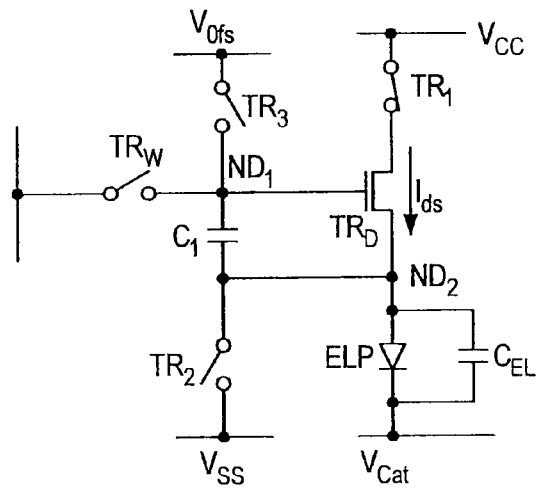
FIG. 6I is an illustration that typically shows ON/OFF state of each of the transistors included in the 5Tr/1C driving circuit according to an embodiment of the present invention, etc.

<A-9>[Period-TP(5)$_7$] (See FIG. 6I)

By the above-described operations, the threshold voltage canceling process, the writing process, and the mobility adjusting process are done. Now, for [Period-TP(5)$_7$], low level of the scan line SCL results in OFF state of the writing transistor TR$_W$ and floating state of the first node ND$_1$, namely the gate electrode of the driving transistor TR$_D$. On the other hand, the first transistor TR$_1$ maintains ON state, the drain area of the driving transistor TR$_D$ is in connection with the power source 2100 (voltage V$_{cc}$, e.g., 20 [volt]). Thus, for [Period-TP(5)$_7$], the potential of the second transistor TR$_2$ increases.

Now, the gate electrode of the driving transistor TR$_D$ is in floating state, and because of the existence of the capacitor C$_1$, the same phenomenon as in so-called bootstrap circuit occurs in the gate electrode of the driving transistor TR$_D$, and also the potential of the first node ND$_1$ increases. As a result, the potential difference V$_{gs}$ between the gate electrode and source area of the driving transistor TR$_D$ maintains the value of Equation 4.

And, for [Period-TP(5)$_7$], the luminescence part ELP starts to be luminous because the potential of the second node ND$_2$ increases to be above (V$_{th-EL}$+V$_{Cat}$). At this point, the current flowing to the luminescence part ELP can be expressed by Equation 1 above because it is the drain current I$_{ds}$ flowing from the drain area of the driving transistor TR$_D$ to the source area of the driving transistor TR$_D$; where, from Equation 1 above and Equation 4 above, Equation 1 above can be transformed into Equation 6 below.

$$I_{ds} = k \cdot \mu \cdot (V_{Sig} - V_{Ofs} - \Delta V)^2 \qquad \text{Equation 6}$$

Therefore, for example, if V$_{Ofs}$ is set to 0 [volt], the current I$_{ds}$ flowing to the luminescence part ELP is proportional to the square of the value obtained by subtracting the value of the picture signal V$_{Sig}$ for controlling the luminance of the luminescence part ELP from the value of the potential adjustment value ΔV of the second node ND$_2$ (the source area of the driving transistor TR$_D$) resulted from the mobility μ of the driving transistor TR$_D$. In other words, the current I$_{ds}$ flowing to the luminescence part ELP does not depend on the threshold voltage V$_{th-EL}$ of the luminescence part ELP and the threshold voltage V$_{th}$ of the driving transistor TR$_D$; namely, the luminescence amount (luminance) of the luminescence part ELP is not affected by the threshold voltage V$_{th-EL}$ of the luminescence part ELP and the threshold voltage V$_{th}$ of the driving transistor TR$_D$. Then, the luminance of the (n, m) luminescence element is a value corresponding to this current I$_{ds}$.

And, larger mobility μ of the driving transistor TR$_D$ results in a larger potential adjustment value ΔV, then the value of V$_{gs}$ on the left side of Equation 4 above becomes smaller. Therefore, even if the value of the mobility μ is large in Equation 6, the value of (V$_{Sig}$-V$_{Ofs}$-ΔV)$^2$ becomes small, and as a result, the drain current I$_{ds}$ can be adjusted. Thus, also if values of picture signal V$_{Sig}$s are the same amongst driving transistors TR$_D$s with different mobility the drain currents I$_{ds}$s will be almost the same, and as a result, the currents I$_{ds}$s flowing to the luminescence part ELP for controlling the luminance of the luminescence part ELP is uniformed. Thus, a 5Tr/1C driving circuit can adjust the variation of the luminance of the luminescence parts resulted from the variation of the mobility μ (and further, the variation of k).

And, luminous state of the luminescence part ELP is maintained until the (m+m'−1)-th horizontal scanning period. This time point corresponds to the end of [Period-TP(5)$_{-1}$].

A 5Tr/1C driving circuit makes a luminescence element luminous by operating as described above.

[2-3-2] 2Tr/1C Driving Circuit

Figure 7:
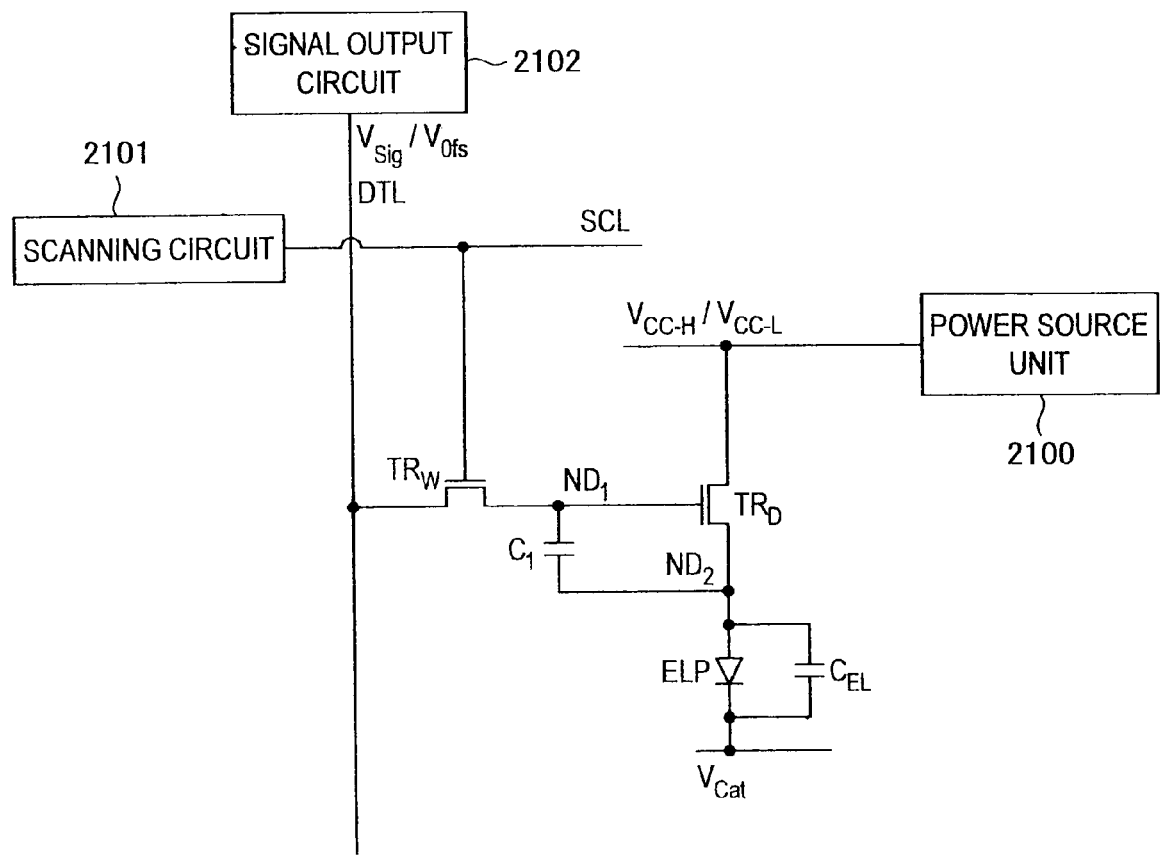
FIG. 7 is an illustration that shows an equivalent circuit for a 2Tr/1C driving circuit according to an embodiment of the present invention.
Figure 8:
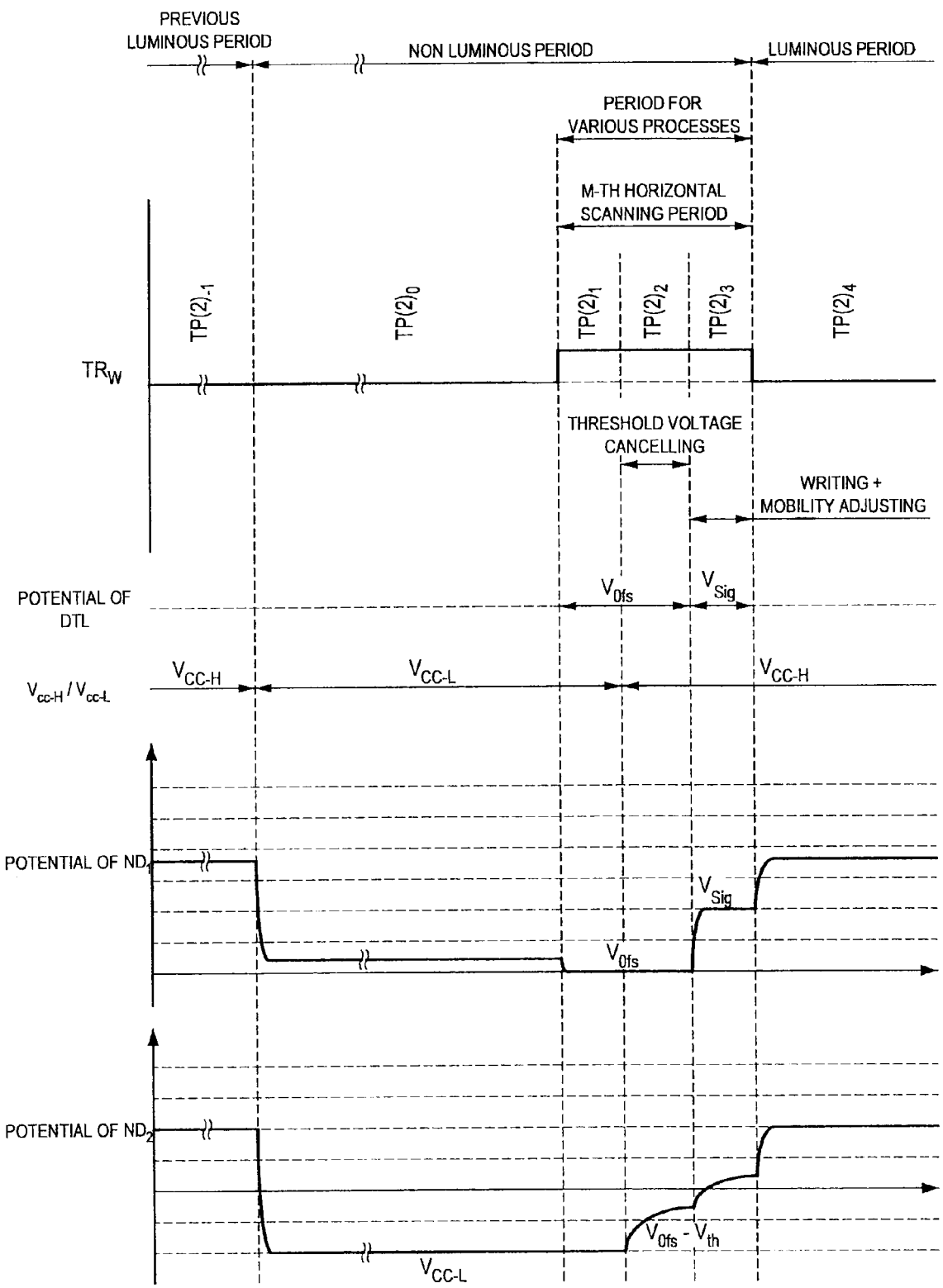
FIG. 8 is a timing chart for driving of the 2Tr/1C driving circuit according to an embodiment of the present invention.

Next, a 2Tr/1C driving circuit will be described. FIG. 7 is an illustration that shows an equivalent circuit for the 2Tr/1C driving circuit according to an embodiment of the present invention. FIG. 8 is a timing chart for driving of the 2Tr/1C driving circuit according to an embodiment of the present invention. FIG. 9A-FIG. 9F are illustrations that typically show ON/OFF state of each of the transistors included in the 2Tr/1C driving circuit according to an embodiment of the present invention, etc.

With reference to FIG. 7, the 2Tr/1C driving circuit omits three transistors, which are the first transistor TR$_1$, the second transistor TR$_2$, and the third transistor TR$_3$, are omitted from the 5Tr/1C driving circuit shown in FIG. 4 described above. In other words, the 2Tr/1C driving circuit includes a writing transistor TR$_W$, a driving transistor TR$_W$, and a capacitor C$_1$.

<Driving Transistor TR$_D$>

The detailed explanation of the configuration the driving transistor TR$_D$ is omitted since it is the same as the configuration of the driving transistor TR$_D$ described with regard to the 5Tr/1C driving circuit shown in FIG. 4. Besides, the drain area of the driving transistor TR$_D$ is connected to the power source unit 2100. And, from the power source unit 2100, the voltage V$_{CC-H}$ for getting the luminescence part ELP luminous and the voltage V$_{CC-L}$ for controlling the potential of the source area of the driving transistor TR$_D$ are supplied. Now, the values of the voltages V$_{CC-H}$ and V$_{CC-L}$ could be as "$V_{CC-H}$=20 [volt]" and "$V_{CC-L}$=–10 [volt]," for example, though they are not limited thereto, of course.

<Writing Transistor $TR_W$>

The configuration of the writing transistor $TR_W$ is the same as the configuration of the writing transistor $TR_W$ described with regard to the 5Tr/1C driving circuit shown in FIG. 4. Therefore, the detailed explanation of the configuration the writing transistor $TR_W$ is omitted.

<Luminescence Part ELP>

The configuration of the luminescence part ELP is the same as the configuration of the luminescence part ELP described with regard to the 5Tr/1C driving circuit shown in FIG. 4. Therefore, the detailed explanation of the configuration the luminescence part ELP is omitted.

In the following, the operation of the 2Tr/1C driving circuit will be described with reference to FIG. 8 and FIG. 9A-FIG. 9F, respectively.

Figure 9A:
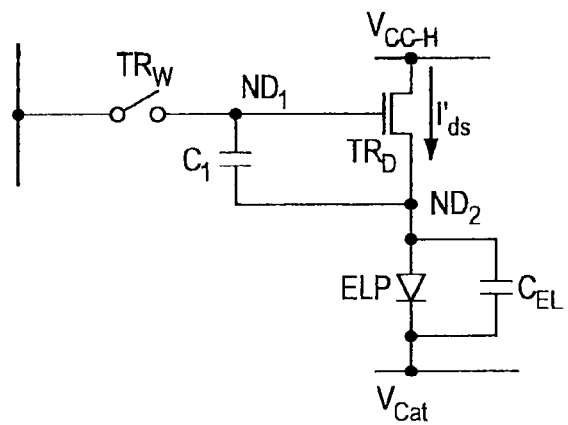
FIG. 9A is an illustration that typically shows ON/OFF state of each of the transistors included in the 2Tr/1C driving circuit according to an embodiment of the present invention, etc.

<B-1>[Period-TP($2$)$_{-1}$](See FIG. 8 and FIG. 9A)

[Period-TP($2$)$_{-1}$] indicates, for example, an operation for a previous display frame, and it is substantially the same operation as that of [Period-TP($5$)$_{-1}$] shown in FIG. 5 described with regard to the 5Tr/1C driving circuit.

[Period-TP($2$)$_0$]-[Period-TP($2$)$_2$] shown in FIG. 8 are periods corresponding to [Period-TP($5$)$_0$]-[Period-TP($5$)$_4$] shown in FIG. 5, and operation periods until just before the next writing process is executed. And, for [Period-TP($2$)$_0$]-[Period-TP($2$)$_2$], similarly to the 5Tr/1C driving circuit described above, the (n, m) luminescence element is basically in non luminous state. Now, the operation of the 2Tr/1C driving circuit is different from the operation of the 5Tr/1C driving circuit in that [Period-TP($2$)$_1$]-[Period-TP($2$)$_2$] are included in the m-th horizontal scanning period in addition to [Period-TP($2$)$_3$], as shown in FIG. 8. Besides, in the following, for the reason of simplicity of the explanation, the explanation will be provided with the assumption that the beginning of [Period-TP($2$)$_1$] and the end of [Period-TP($2$)$_3$] match the beginning and end of the m-th horizontal scanning period, respectively.

In the following, each period of [Period-TP($2$)$_0$]-[Period-TP($2$)$_2$] will be described. Besides, the length of each period of [Period-TP($2$)$_1$]-[Period-TP($2$)$_2$] can be optionally set according to the settings of the display device 100, similarly to the 5Tr/1C driving circuit described above.

Figure 9B:
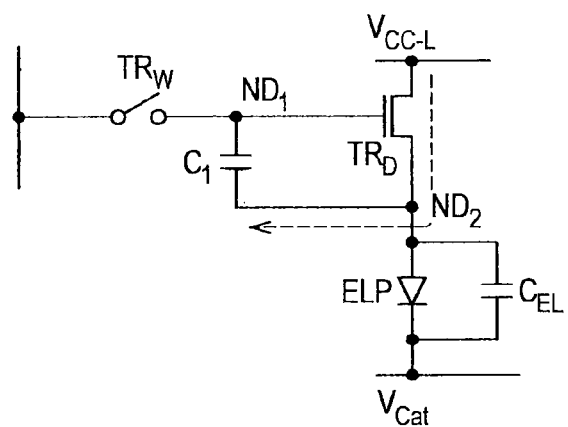
FIG. 9B is an illustration that typically shows ON/OFF state of each of the transistors included in the 2Tr/1C driving circuit according to an embodiment of the present invention, etc.

<B-2>[Period-TP($2$)$_0$] (See FIG. 8 and FIG. 9B)

[Period-TP($2$)$_0$] indicates, for example, an operation from the previous display frame to the current display frame. More specifically, [Period-TP($2$)$_0$] is a period from the (m+m')-th horizontal scanning period in the previous display frame to the (m–1)-th horizontal scanning period in the current display frame. And for this [Period-TP($2$)$_0$], the (n, m) luminescence element is in non luminous state. Now, at the time point for transition from [Period-TP($2$)$_{-1}$] to [Period-TP($2$)$_0$], the voltage supplied from the power source unit 2100 is switched from $V_{CC-H}$ to voltage $V_{CC-L}$. As a result, the potential of the second node $ND_2$ is lowered to $V_{CC-L}$, and the luminescence part ELP gets into non luminous state. And, as the potential of the second node $ND_2$ gets lower, the potential of the first node $ND_1$ in floating state (the gate electrode of the driving transistor $TR_D$) is also lowered.

Figure 9C:
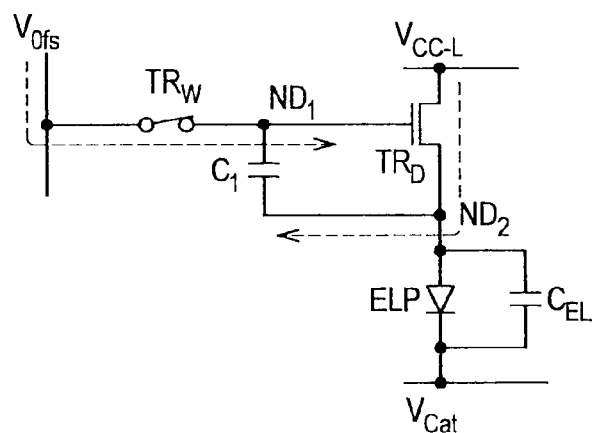
FIG. 9C is an illustration that typically shows ON/OFF state of each of the transistors included in the 2Tr/1C driving circuit according to an embodiment of the present invention, etc.

<B-3>[Period-TP($2$)$_1$] (See FIG. 8 and FIG. 9C)

The horizontal scanning period for the m-th row begins at [Period-TP($2$)$_1$]. Now, for this [Period-TP($2$)$_1$], a pre-process for executing the threshold voltage canceling process is executed. At the beginning of [Period-TP($2$)$_1$], the writing transistor $TR_W$ is got into ON state, by getting the potential of the scan line SCL to be at high level. As a result, the potential of the first node $ND_1$ becomes $V_{Ofs}$ (e.g., 0 [volt]). And, the potential of the second node $ND_2$ is maintained at $V_{CC-L}$ (e.g., –10 [volt]).

Thus, for [Period-TP($2$)$_1$], the potential between the gate electrode and source area of the driving transistor $TR_D$ becomes above $V_{th}$, and the driving transistor $TR_D$ gets into ON state.

Figure 9D:
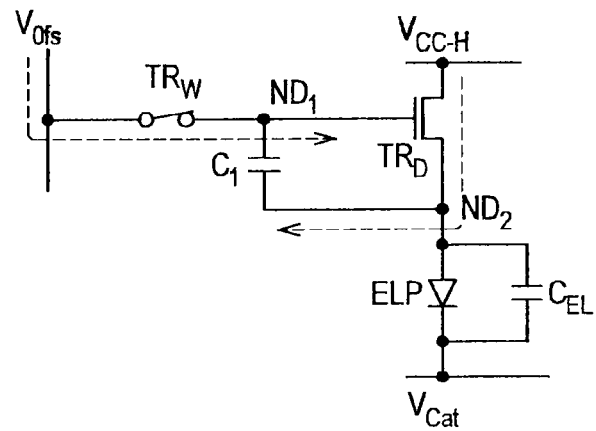
FIG. 9D is an illustration that typically shows ON/OFF state of each of the transistors included in the 2Tr/1C driving circuit according to an embodiment of the present invention, etc.

<B-4>[Period-TP($2$)$_2$] (See FIG. 8 and FIG. 9D)

The threshold voltage canceling process is executed for [Period-TP($2$)$_2$]. Specifically, for [Period-TP($2$)$_2$], the voltage supplied from the power source unit 2100 is switched from $V_{CC-L}$ to the voltage $V_{CC-H}$, with the writing transistor $TR_W$ maintained in ON state. As a result, for [Period-TP($2$)$_2$], the potential of the first node $ND_1$ does not change ($V_{Ofs}$=0 [volt] maintained), whilst the potential of the second node $ND_2$ changes towards the potential obtained by subtracting the threshold voltage $V_{th}$ of the driving transistor $TR_D$ from the potential of the first node $ND_1$. Hence, the potential of the second node $ND_2$ in floating state increases. Then, when the potential difference between the gate electrode and source area of the driving transistor $TR_D$ reaches to $V_{th}$, the driving transistor $TR_D$ gets into OFF state. More specifically, the potential of the second node $ND_2$ in floating state approaches to ($V_{Ofs}$–$V_{th}$=–3 [volt]) to be ($V_{Ofs}$–$V_{th}$) in the end. Now, if Equation 2 above is assured, in other words, if the potentials are selected and determined to satisfy Equation 2 above, the luminescence part ELP will not be luminous.

For [Period-TP($2$)$_3$], the potential of the second node $ND_2$ will be ($V_{Ofs}$–$V_{th}$) eventually. Therefore, the potential of the second node $ND_2$ is determined, depending on the threshold voltage $V_{th}$ of the driving transistor $TR_D$, and on the potential $V_{Ofs}$ for initialising the gate electrode of the driving transistor $TR_D$. In other words, the potential of the second node $ND_2$ does not depend on the threshold voltage $V_{th-EL}$ of the luminescence part ELP.

Figure 9E:
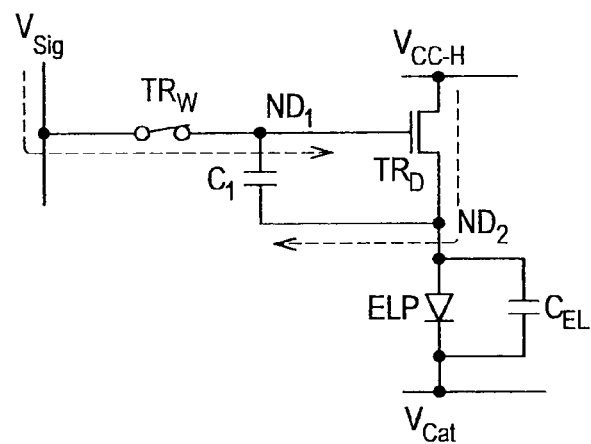
FIG. 9E is an illustration that typically shows ON/OFF state of each of the transistors included in the 2Tr/1C driving circuit according to an embodiment of the present invention, etc.
Figure 9F:
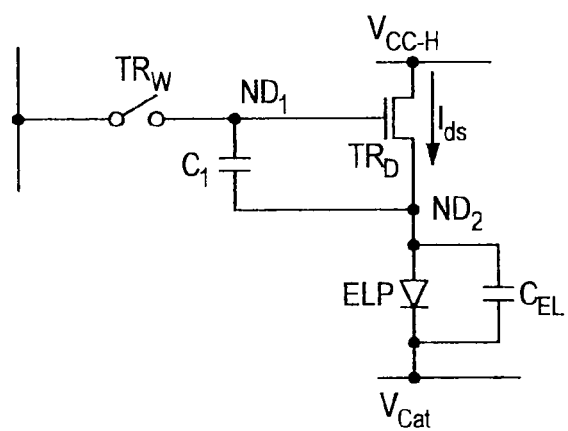
FIG. 9F is an illustration that typically shows ON/OFF state of each of the transistors included in the 2Tr/1C driving circuit according to an embodiment of the present invention, etc.

<B-5>[Period-TP($2$)$_3$] (See FIG. 8 and FIG. 9E)

For [Period-TP($2$)$_3$], the writing process for the driving transistor $TR_D$, and an adjustment (mobility adjustment process) on the potential of the source area of the driving transistor $TR_D$ (the second node $ND_2$) based on the magnitude of the mobility μ of the driving transistor $TR_D$ are executed. Specifically, for [Period-TP($2$)$_3$], the data line DTL is made to be $V_{Sig}$ for controlling the luminance of the luminescence part ELP with the writing transistor $TR_W$ maintained in OFF state. As a result, the potential of the first node $ND_1$ increases to $V_{Sig}$, and the driving transistor $TR_D$ gets into ON state. Besides, the way of bringing the driving transistor $TR_D$ into ON state is not limited thereto; for example, the driving transistor $TR_D$ gets into ON state by bringing the writing transistor $TR_W$ into ON state. Hence, for example, the 2Tr/1C driving circuit can bring the driving transistor $TR_D$ into ON state by getting the writing transistor $TR_W$ into OFF state temporally, changing the potential of the data line DTL into a picture signal $V_{Sig}$ for controlling the luminance of the luminescence part ELP, getting the scan line SCL to be at high level, and then bringing the writing transistor $TR_W$ into ON state.

Now, for [Period-TP($2$)$_3$], unlike the case of the 5Tr/1C described above, the potential of the source area of the driving transistor $TR_D$ increases since the voltage $V_{CC-H}$ is applied to the drain area of the driving transistor $TR_D$ by power source unit 2100. And for [Period-TP($2$)$_3$], by getting the scan line SCL to be at low level after a predetermined time ($t_0$) has passed, the writing transistor $TR_W$ is brought into OFF state, and the first node $ND_1$ (the gate electrode of the driving transistor $TR_D$) gets into floating state. Now, the total time $t_0$ of [Period-TP($2$)$_3$] may be determined in advance as a configuration value during the configuration of the display device 100 so that the potential of the second node $ND_2$ is ($V_{Ofs} - V_{th} + \Delta V$).

For [Period-TP(2)$_3$], by the processes described above, if the value of the mobility μ of the driving transistor $TR_D$ is large, then the increased amount $\Delta V$ of the potential of the source area of the driving transistor $TR_D$ is large, and if the value of the mobility μ of the driving transistor $TR_D$ is small, then the increased amount $\Delta V$ of the potential of the source area of the driving transistor $TR_D$ is small. Thus, adjustment on mobility is executed for [Period-TP(2)$_3$].

<B-6>[Period-TP(2)$_4$] (See FIG. 8 and FIG. 9E)

By the operations described above, the threshold voltage canceling process, the writing process, and the mobility adjusting process are done in the 2Tr/1C driving circuit. For [Period-TP(2)$_4$], the same process as that of [Period-TP(5)$_7$] described with regard to the 5Tr/1C driving circuit is executed; namely, for [Period-TP(2)$_4$], the potential of the second node $ND_2$ increases to be above ($V_{th-EL} + V_{Cat}$), so that the luminescence part ELP starts to be luminous. And at this point, the current flowing to the luminescence part ELP can be specified by Equation 6 above, therefore, the current $I_{ds}$ flowing to the luminescence part ELP does not depend on the threshold voltage $V_{th-EL}$ of the luminescence part ELP and the threshold voltage $V_{th}$ of the driving transistor $TR_D$; namely, the luminescence amount (luminance) of the luminescence part ELP is not affected by the threshold voltage $V_{th-EL}$ of the luminescence part ELP and the threshold voltage $V_{th}$ of the driving transistor $TR_D$. Furthermore, the 2Tr/1C driving circuit may prevent the occurrence of the variation of the drain current $I_{ds}$ resulted from the variation of the mobility μ of the driving transistor $TR_D$.

Then, Luminous state of the luminescence part ELP is maintained until the (m+m'−1)-th horizontal scanning period. This time point corresponds to the end of [Period-TP(5)$_1$].

Thus, the luminescence operation of the luminescence element 10 included in the (n, m) sub-pixel is done.

Figure 10:
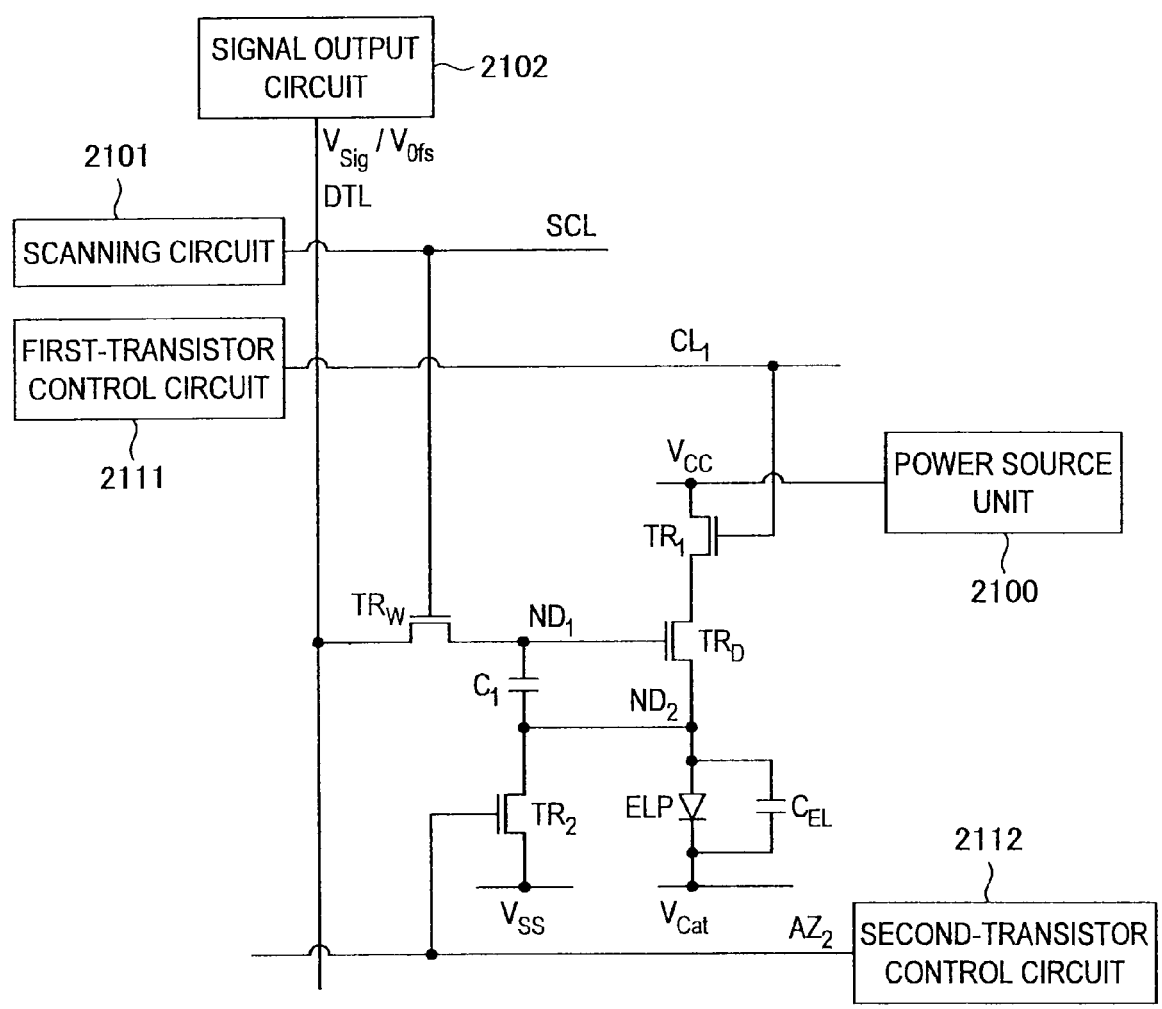
FIG. 10 is an illustration that shows an equivalent circuit for a 4Tr/1C driving circuit according to an embodiment of the present invention.
Figure 11:
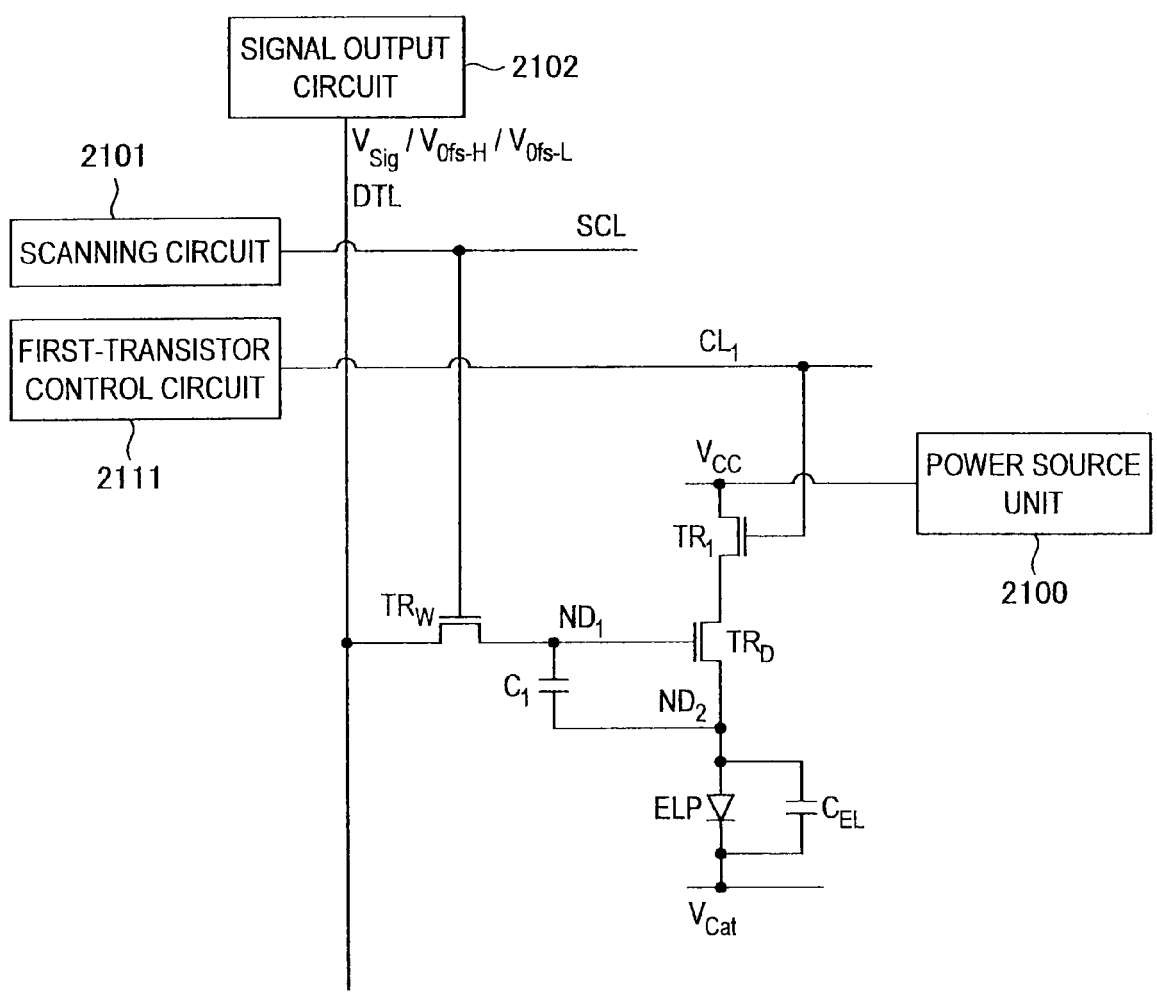
FIG. 11 is an illustration that shows an equivalent circuit for a 3Tr/1C driving circuit according to an embodiment of the present invention.

In the above, the 5Tr/1C driving circuit and the 2Tr/1C driving circuit have been described as driving circuits according to an embodiment of the present invention, though driving circuits according to an embodiment of the present invention are not limited thereto. For example, a driving circuit according to an embodiment of the present invention may be formed out of a 4Tr/1C driving circuit shown in FIG. 10 or a 3Tr/1C driving circuit shown in FIG. 11.

Also in the above, it is illustrated that the writing process and the mobility adjustment are executed individually, though the operation of a 5Tr/1C driving circuit according an embodiment of the present invention is not limited thereto. For example, similarly to the 2Tr/1C driving circuit described above, a 5Tr/1C driving circuit may be configured to execute the writing process along with the mobility adjusting process. Specifically, a 5Tr/1C may configured to apply a picture signal $V_{Sig\_m}$ to the first node from a data line DTL via a writing transistor $T_{Sig}$ for [Period-TP(5)$_5$] in FIG. 5, for example, with a luminescence control transistor $T_{EL\_C}$ in ON state.

The panel 158 of the display device 100 according to an embodiment of the present invention may be configured to include pixel circuits and driving circuits as described above. Besides, the panel 158 according to an embodiment of the present invention is not, of course, limited to the configuration in which pixel circuits and driving circuits as described above are included.

(Control Over Luminous Time within 1 Frame Period and Gain of Picture Signal)

Next, there will be described control over a luminous time within one frame period and a gain of a picture signal, according to an embodiment of the present invention. The control over a luminous time within one frame period and a gain of a picture signal according to an embodiment of the present invention may be executed by the luminous time controller 126 of the picture signal processor 110.

Figure 12:
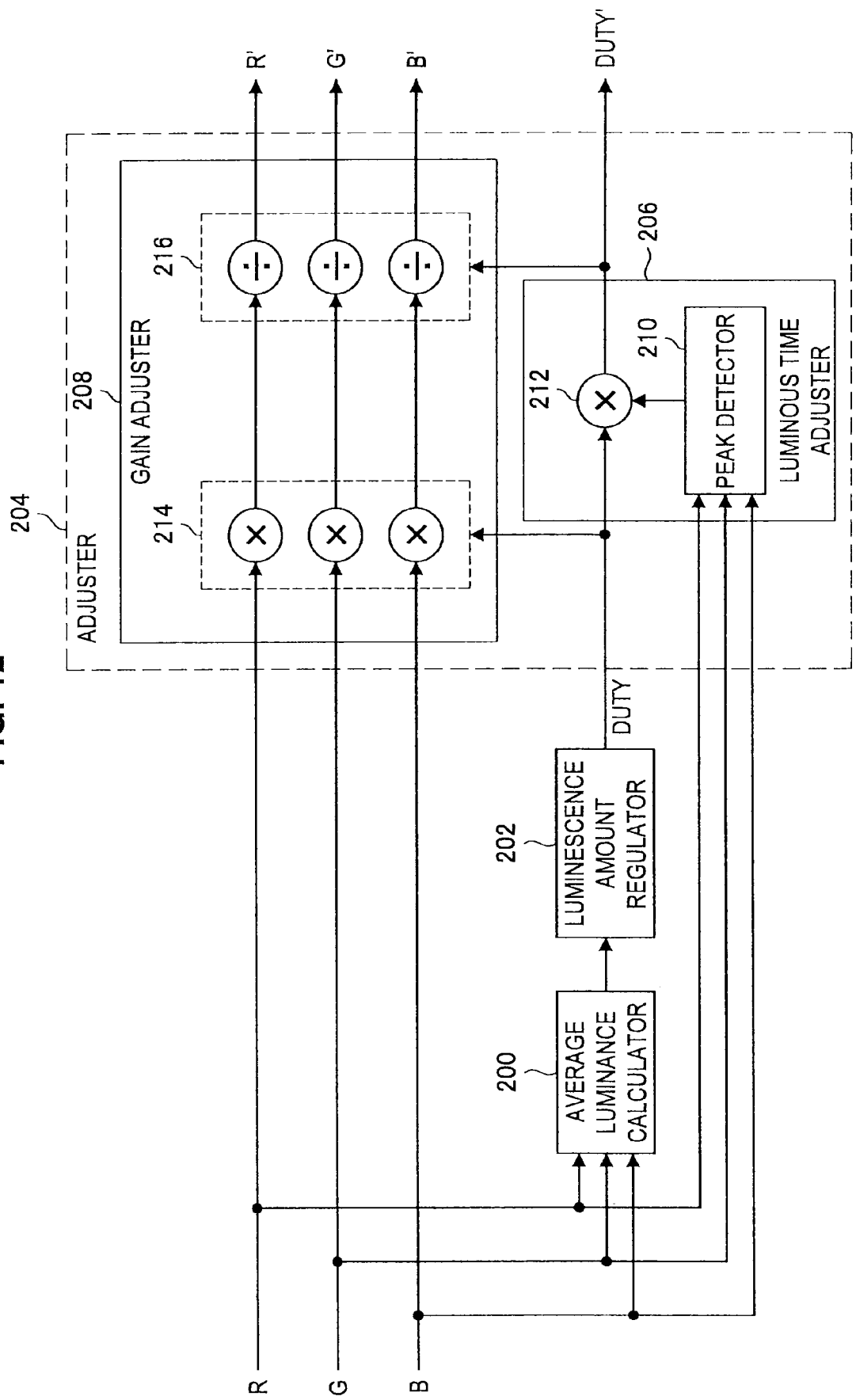
FIG. 12 is a block diagram that shows an example of a luminous time controller according to an embodiment of the present invention.

FIG. 12 is a block diagram that shows an example of the luminous time controller 126 according to an embodiment of the present invention. In the following, the explanation will be provided with assumption that a picture signal input into the luminous time controller 126 is a signal which corresponds to an image for each one frame period and which is provided separately for each colour of R, G and B.

With reference to FIG. 12, the luminous time controller 126 includes an average luminance calculator 200, a luminescence amount regulator 202, and an adjuster 204.

The average luminance calculator 200 calculates an average value of luminance for a predetermined period. Now, such a predetermined period could be one frame period, for example, though it is not limited thereto; it could be two frame periods, for example. The predetermined period for the following explanation is one frame period.

[Configuration of Average Luminance Calculator 200]

Figure 13:
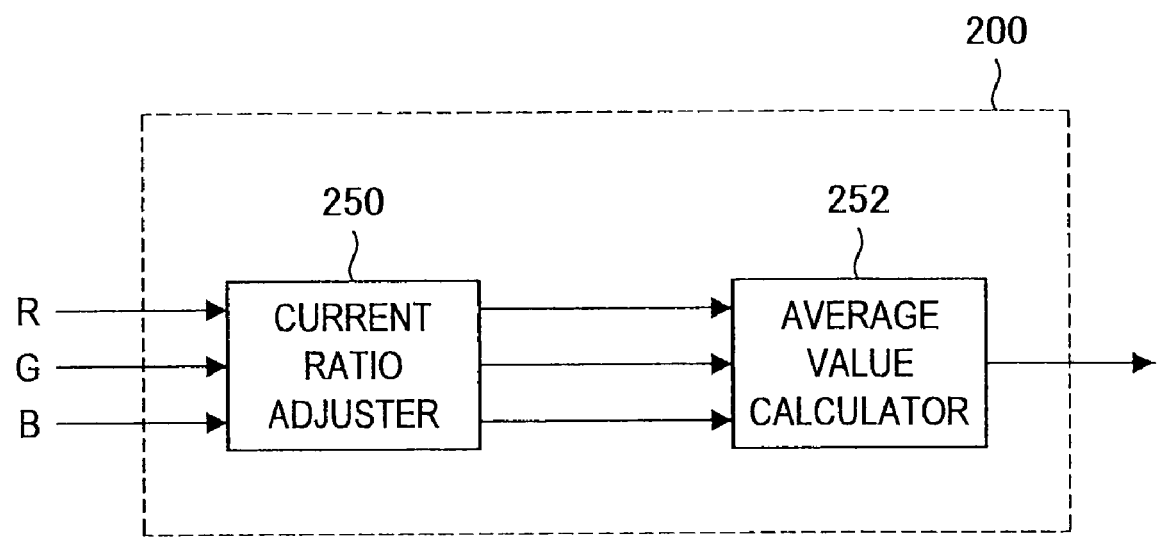
FIG. 13 is a block diagram that shows an average luminance calculator according to an embodiment of the present invention.

FIG. 13 is a block diagram that shows the average luminance calculator 200 according to an embodiment of the present invention. With reference to FIG. 13, the average luminance calculator 200 includes a current ratio adjuster 250 and an average value calculator 252.

The current ratio adjuster 250 adjusts the current ratio for input picture signals for R, G, and B by respectively multiplying the input picture signals for R, G, and B by adjustment coefficients, which are respectively predetermined for the colours. Now, the above-mentioned predetermined adjustment coefficients are values that correspond to respective V-I ratios (voltage-current ratios) of an R luminescence element, a G luminescence element, and a B luminescence element so as to differ from each other in respect to their corresponding colours.

Figure 14:
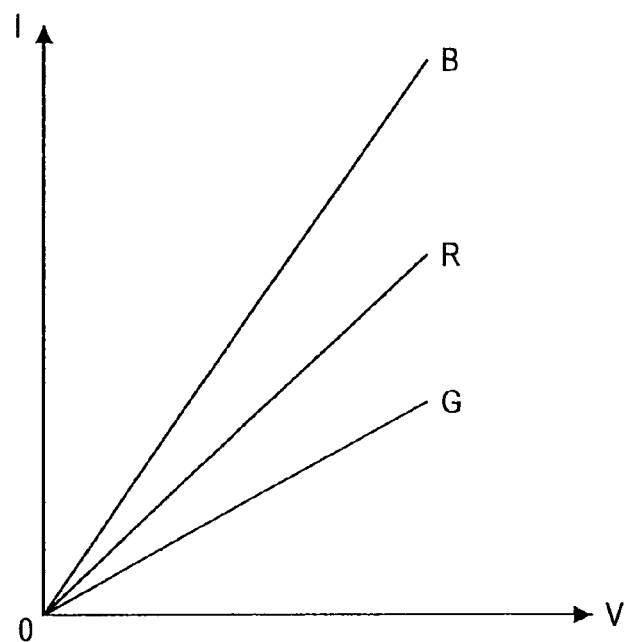
FIG. 14 is an illustration that shows an example of each V-I ratio of a luminescence element for each colour included in a pixel according to an embodiment of the present invention.

FIG. 14 is an illustration that shows an example of each V-I ratio of a luminescence element for each colour included in a pixel according to an embodiment of the present invention. As shown in FIG. 14, the V-I ratio of a luminescence element for a colour included in a pixel is different from the ratios of those for the other colours, as "B luminescence element>R luminescence element>G luminescence element." Now, as shown in FIG. 2A-FIG. 2F, the display device 100 can execute a process in a linear region with the gamma value unique to the panel 158 cancelled by multiplying a gamma curve inverse to the gamma curve that is unique to the panel 158 by the gamma converter 132. Thus, for example, respective V-I ratios of an R luminescence element, a G luminescence element, and a B luminescence element can be obtained by fixing the duty to a predetermined value (e.g., "0.25") and deriving in advance the V-I relations as shown in FIG. 14.

Besides, the current ratio adjuster 250 may include memory means, and the above-mentioned adjustment coefficients used by the current ratio adjuster 250 may be stored in the memory means. Now, examples of such memory means included in the current ratio adjuster 250 include non volatile memories, such as EEPROMs and flash memories, but are not limited thereto. And, the above-mentioned adjustment coefficients used by the current ratio adjuster 250 may be held in memory means included in the display device 100, such as the recorder 106 or the memory 150, and read out by the current ratio adjuster 250 at appropriate occasions.

The average value calculator 252 calculates average luminance (APL: Average Picture Level) for one frame period from R, G, and B picture signals adjusted by the current ratio adjuster 250. Now, examples of the way of calculating average luminance for one frame period by the average value calculator include using the arithmetic mean, but are not limited thereto; for example, the calculation may be carried out by use of the geometric mean and a weighted mean.

The average luminance calculator 200 calculates average luminance for one frame period as described above, and outputs it.

With reference to FIG. 12 again, the luminescence amount regulator 202 set a reference duty depending on average luminance calculated by the average luminance calculator 200, where the reference duty is a duty as a reference for regulating a luminescence amount for each one frame period.

A luminescence amount for one frame period can be expressed by Equation 7 below, where "Lum" shown in Equation 7 denotes a "luminescence amount," "Sig" denotes a "signal level," and "Duty" denotes a "luminous time."

$$Lum=(Sig)\times(Duty) \quad \text{(Equation 7)}$$

As shown in Equation 7, by setting a reference duty, a luminescence amount will depend only on the signal level of a picture signal, namely the gain of a picture signal.

And, a reference duty can be set by the luminescence amount regulator 202 by use of a Look Up Table in which average luminance for one frame period and reference duties are correlated, for example.

[Way of Deriving Value Held in Look Up Table According to Embodiment of Present Invention]

Figure 15:
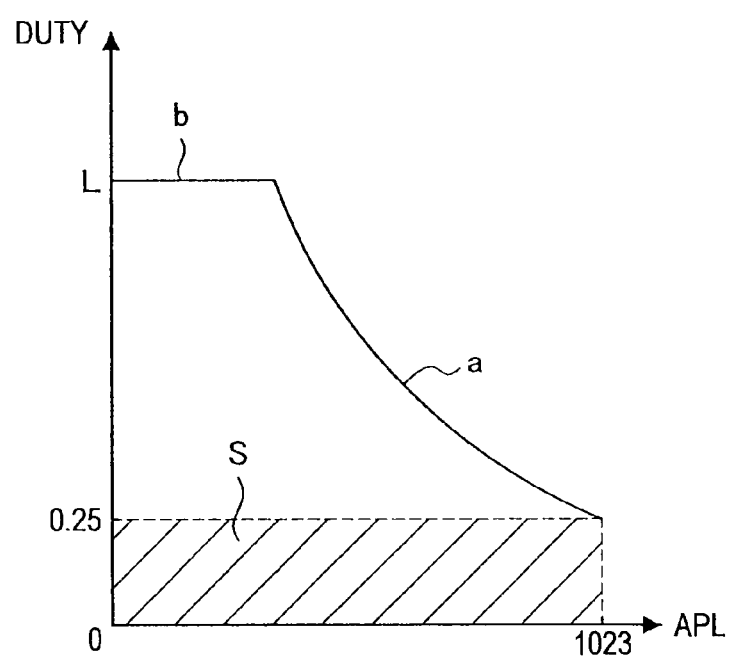
FIG. 15 is an illustration that illustrates the way of deriving a value held in a look-up table according to an embodiment of the present invention.

Now, the way of deriving a value held in the Look Up Table according to an embodiment of the present invention will be described. FIG. 15 is an illustration that illustrates the way of deriving a value held in the Look Up Table according to an embodiment of the present invention, where the relation between average luminance (APL) for one frame period and a reference duty is shown. Besides, there is shown in FIG. 15 for example the case where the average luminance for one frame period is digital data of 10 bits, whilst average luminance for 1 frame period is not, of course, limited to digital data of 10 bits.

In the Look Up Table according to an embodiment of the present invention, average luminance for one frame period and reference duties are held in respective correlation so as to take the values on the curve a and the straight line b shown in FIG. 15.

And, the Look Up Table according to an embodiment of the present invention is derived with reference to the luminescence amount for the case where the luminance is at its maximum for a predetermined duty, for example (and in this case, an image in "white" is displayed on the panel 158).

The area S shown in FIG. 15 represents the luminescence amount for the case where the reference duty is set to 25% so that the luminance is at its maximum.

The curve a shown in FIG. 15 is a curve passing through values of average luminance (APL) for one frame period and the reference duty that have their products equal to the area S in the case where the reference duty is larger than 25%.

The straight line b shown in FIG. 15 is a straight line that regulates the upper limit L of the reference duty for the curve a. As shown in FIG. 15, in the Look Up Table according to an embodiment of the present invention, an upper limit may be provided for the reference duty. For example, an upper limit may be provided for the reference duty in an embodiment of the present invention for purpose of solving an issue due to the relation of trade off between "luminance" related to the duty and "blurred movement" given when a moving image is displayed. The issue due to the relation of trade off between "luminance" according to the duty and "blurred movement" here is as follows.

<For Large Duty>
  Luminance: higher
  Blurred Movement: heavier
<For Small Duty>
  Luminance: lower
  Blurred Movement: lighter Therefore, in the Look Up Table according to an embodiment of the present invention, the upper limit L of a reference duty is set and a certain balance between "luminance" and "blurred movement" is achieved for purpose of solving the issue due to the relation of trade off between luminance and blurred movement. Now, the upper limit L of the reference duty may be set, for example, according to the characteristic of the panel 158 included in the display device 100 (e.g., characteristics of luminescence elements).

For example, by use of the Look Up Table in which average luminance for one frame period and reference duties are held in respective correlation so as to take values on the curve a and the straight line b shown in FIG. 15, the luminescence amount regulator 202 may set a reference duty according to the average luminance for one frame period calculated by the average luminance calculator 200.

FIG. 12 is now referred again to be explained. The adjuster 204 includes a luminous time adjuster 206 and a gain adjuster 208.

The luminous time adjuster 206 adjusts a reference duty based on the reference duty set by the luminescence amount regulator 202 and an input picture signal, and outputs an effective duty for practically regulating luminous time within one frame period for the display device 100. In the following, "effective duty adjustment" refers to adjusting a reference duty and outputting an effective duty by the luminous time adjuster 206.

The gain adjuster 208 adjusts the gains of input R, G, and B picture signals in correspondence to the effective duty adjustment by the luminous time adjuster 206.

[Relation Between Effective Duty Adjustment and Adjustment on Gain of Picture Signal]

As shown in Equation 7, a luminescence amount can be expressed by the product of a signal level and a luminous time. And, as described above, the smaller a duty is, the smaller "blurred movement" is given when a moving image is displayed. Then, with the display device 100 according to an embodiment of the present invention, effective duty adjustment is executed along with adjustment on the gain of a picture signal so that "blurred movement" given when a moving image is displayed gets smaller with the luminescence amount maintained. Besides, for example, when a still image, for which "blurred movement" is not necessarily considered, is displayed, the display device 100 according to an embodiment of the present invention can, of course, execute effective duty adjustment along with adjustment on the gain of a picture signal so that the duty gets larger.

Figure 16A:
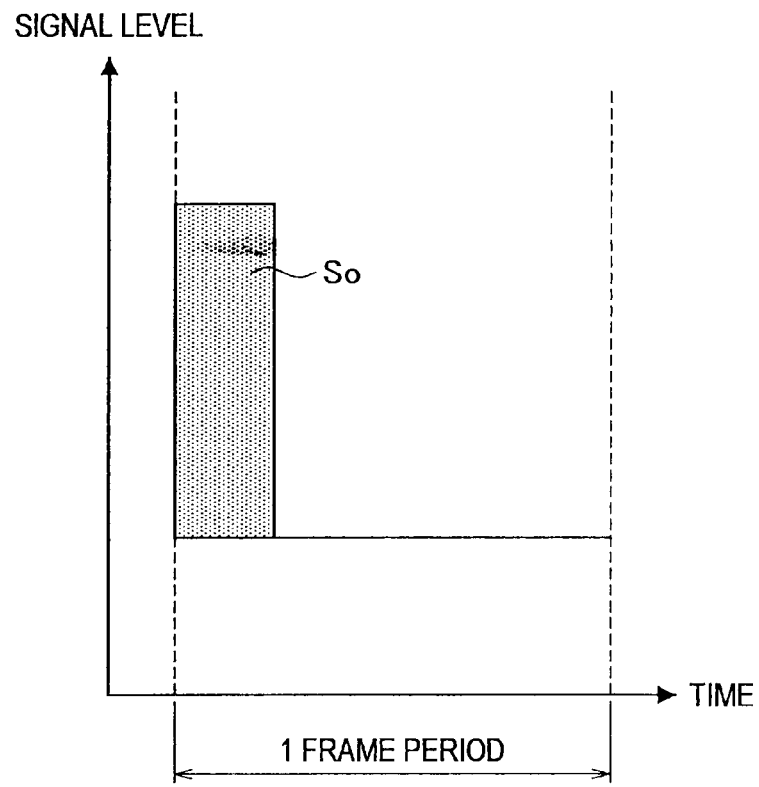
FIG. 16A is an illustration for illustrating the relation between adjustment on a duty and adjustment on a gain of a picture signal, according to an embodiment of the present invention.
Figure 16B:
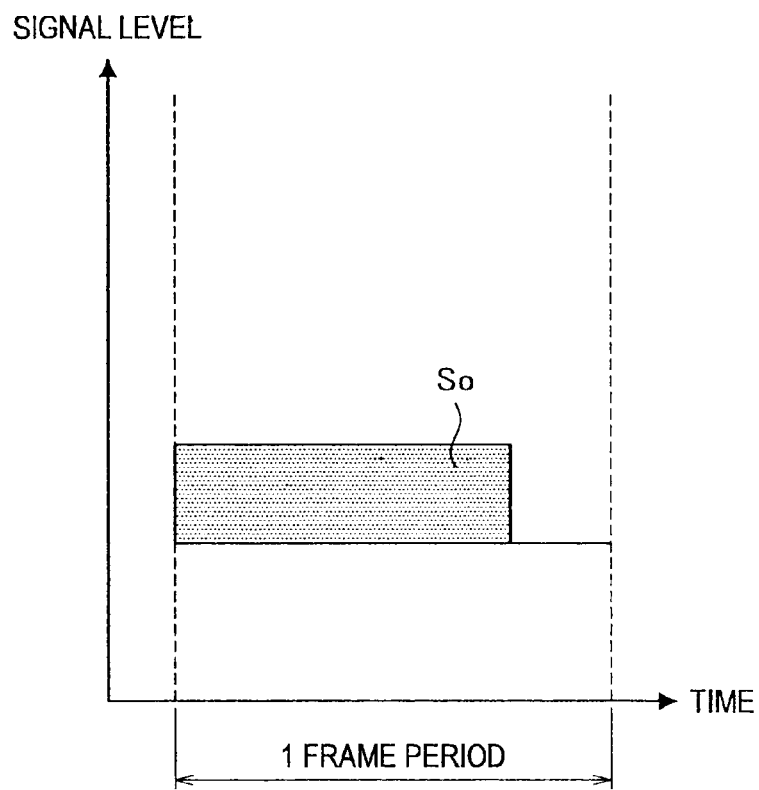
FIG. 16B is an illustration for illustrating the relation between adjustment on a duty and adjustment on a gain of a picture signal, according to an embodiment of the present invention.

FIG. 16A and FIG. 16B are illustrations for illustrating the relation between effective duty adjustment and adjustment on a gain of a picture signal, according to an embodiment of the present invention, where FIG. 16A shows the state of a picture signal before adjustment whilst FIG. 16B shows the state of a picture signal after adjustment.

As shown in FIG. 16A and FIG. 16B, for the display device 100, the luminous time adjuster 206 shortens a luminous time (i.e., an effective duty is made smaller than or equal to a reference duty), and the gain adjuster 208 enlarges (amplifies) the gain of a picture signal depending on the reduction ratio of the effective duty to the reference duty, so that the luminescence amount of the picture signal before adjustment (the area $S_o$ in FIG. 16A) and the luminescence amount of the picture signal after adjustment (the area $S_o$ in FIG. 16B) are the same.

The luminous time adjuster 206 and the gain adjuster 208 adjust the setting of a duty and the gain of a picture signal as shown in FIG. 16A and FIG. 16B, for example, so that blurred movement given when a moving image is displayed can get smaller without any change in the luminescence amount.

And, even if a picture signal input into the display device 100 is a signal with a low gain, the display device 100 can also display a picture and an image in a luminescence state like an impulse as shown in FIG. 16B by effective duty adjustment by the luminous time adjuster 206 and adjustment on the gain of the picture signal by the gain adjuster 208.

Thus, the display device 100 can provide high definition with a luminescence amount maintained by effective duty adjustment by the luminous time adjuster 206 and adjustment on the gain of a picture signal by the gain adjuster 208.

In the following, with reference to FIG. 12 again, the effective duty adjustment by the luminous time adjuster 206 and the adjustment on the gain of a picture signal by the gain adjuster 208 will be described respectively.

[Effective Duty Adjustment]

The luminous time adjuster 206 includes a peak detector 210 and a luminous time adjuster 212.

Based on R, G, and B picture signals input within one frame period (predetermined period), the peak detector 210 detects the maximum value of the luminance for the picture signals. Now, the maximum value (LumM) of the luminance for the picture signals detected by the peak detector 210 can be expressed by a value relative to the maximum value of the luminance that the picture signals can take, as shown in Equation 8 below, where "Peak" shown in Equation 8 denotes "the maximum of the luminance for any one of R, G and B," and "LumMax" denotes "the maximum value of the luminance that the picture signal can take."

$$\text{LumM} = (\text{Peak})/(\text{LumMax}) \quad \text{(Equation 8)}$$

For example, if the picture signals are digital data of 14 bits, the maximum value of the luminance for the picture signals will be LumM=Peak/16384. And, in the above case, Peak will be a value equal to or smaller than 16384.

The luminous time adjuster 212 adjusts the effective duty by multiplying the reference duty set by the luminescence amount regulator 202 by the maximum value of the luminance for the picture signals detected by the peak detector 210. As shown in Equation 8, the maximum value of the luminance for the picture signals detected by the peak detector 210 is expressed by a value relative to the maximum value of the luminance that the picture signals can take, and hence results in $0 \leq \text{LumM} \leq 1$. Therefore, the effective duty (Duty') output from the luminous time adjuster 212 will be equal to or smaller than the reference duty set by the luminescence amount regulator 202 as shown in Equation 9 below.

$$\text{Duty}' = (\text{Duty}) \times (\text{LumM}) \quad \text{(Equation 9)}$$
$$(\text{Duty}) \times \{(\text{Peak})/(\text{LumMax})\}$$

[Adjustment on Gain of Picture Signal]

The gain adjuster 208 includes a first gain adjuster 214 and a second gain adjuster 216.

The first gain adjuster 214 multiplies each of the input R, G, and B picture signals by the reference duty set by the luminescence amount regulator 202.

The second gain adjuster 216 divides each of the R, G, and B picture signals adjusted by the first gain adjuster 214 by the effective duty (Duty') output from the luminous time adjuster 212.

Now, the adjusted R picture signal (R'), the adjusted G picture signal (G'), and the adjusted B picture signal (B'), which are output from the gain adjuster 208, can be expressed as Equation 10-Equation 12 below.

$$R' = \{(R) \times (\text{Duty})\}/(\text{Duty}') \quad \text{(Equation 10)}$$
$$= (R) \times \{(\text{LumMax})/(\text{Peak})\}$$

$$G' = \{(G) \times (\text{Duty})\}/(\text{Duty}') \quad \text{(Equation 11)}$$
$$= (G) \times \{(\text{LumMax})/(\text{Peak})\}$$

$$B' = \{(B) \times (\text{Duty})\}/(\text{Duty}') \quad \text{(Equation 12)}$$
$$= (B) \times \{(\text{LumMax})/(\text{Peak})\}$$

Thus, as shown in FIG. 16B, the adjusted R, G, and B picture signals output from the gain adjuster 208 will be picture signals amplified with respective gains of the input R, G and B picture signals according to the reduction ratio of the effective duty to the reference duty.

[Alternative Examples of Luminous Time Controller 126]

In the above, an example of the luminous time controller 126 according to an embodiment of the present invention has been described with reference to FIG. 12, though the configuration of the luminous time controller 126 according to an embodiment of the present invention is not limited to the configuration shown in FIG. 12. For example, the luminous time controller 126 may set a reference duty according to the maximum value of luminance with a maximum luminance detector replacing the average luminance calculator 200 in FIG. 12; the maximum luminance detector detects the maximum value of luminance.

And, for the luminous time controller 126 according to an embodiment of the present invention, the configuration for setting a reference duty according to input picture signals (more strictly, average luminance of the picture signals) has been described. However, the luminous time controller 126 according to an embodiment of the present invention is not limited thereto; for example, a reference duty can be set in advance. By setting a reference duty in advance, the circuit configuration of the luminous time controller 126 according to an embodiment of the present invention can be simplified, for example.

Even if the luminous time controller 126 is configured as described above, the display device 100 can control the gain of a picture signal with the luminescence amount maintained as the same.

As described above, the display device 100 according to an embodiment of the present invention calculates average luminance from R, G, and B picture signals input within one frame period (predetermined period), and sets a reference duty according to the calculated average luminance. And, the display device 100 adjusts an effective duty, based on the set reference duty and the maximum luminance for one frame period for the input R, G, and B picture signals. Furthermore, the display device 100 adjusts the gains of the input R, G, and B picture signals with the luminescence amount maintained as the same, based on the reference duty according to the average luminance and on the effective duty. Thus, the display device 100 can control the luminous time (effective duty) within one frame period and the gain of a picture signal with the luminescence amount maintained as the same.

And, the setting of a duty and the adjustment on the gain of a picture signal by the display device 100 make an effective duty equal to or smaller than a reference duty, and amplifies the gain of the picture signal according to the reduction ration of the effective duty to the reference duty so that the luminescence amount remains as the same. Thus, the display device 100 can have smaller blurred movement given when a moving picture is displayed, without changing the luminescence amount.

And, even if a picture signal input into the display device 100 is a signal with a low gain, the display device 100 can also display a picture and an image in a luminescence state like an impulse, so that high definition can be achieved with the luminescence amount maintained.

Furthermore, the display device 100 can have the linear relation between the light amount of an object indicated by an input picture signal and the luminescence amount of luminescence elements. Thus, the display device 100 can display a picture and an image accurately according to the input picture signal.

And, the display device 100 has described for an embodiment of the present invention, though embodiments of the present invention are not limited thereto; for example, embodiments of the present invention may be applied to a self-luminescence type television set for receiving the television broadcasts and displaying pictures, and to a computer, such as a PC (Personal Computer), with display means outside or inside thereof, for example.

[Program According to Embodiment of Present Invention]

By a program for causing a computer to function as the display device 100 according to an embodiment of the present invention, the luminous time within one frame period and the gain of a picture signal can be controlled with the luminescence amount maintained as the same.

[Picture Signal Processing Method According to Embodiment of Present Invention]

Figure 17:
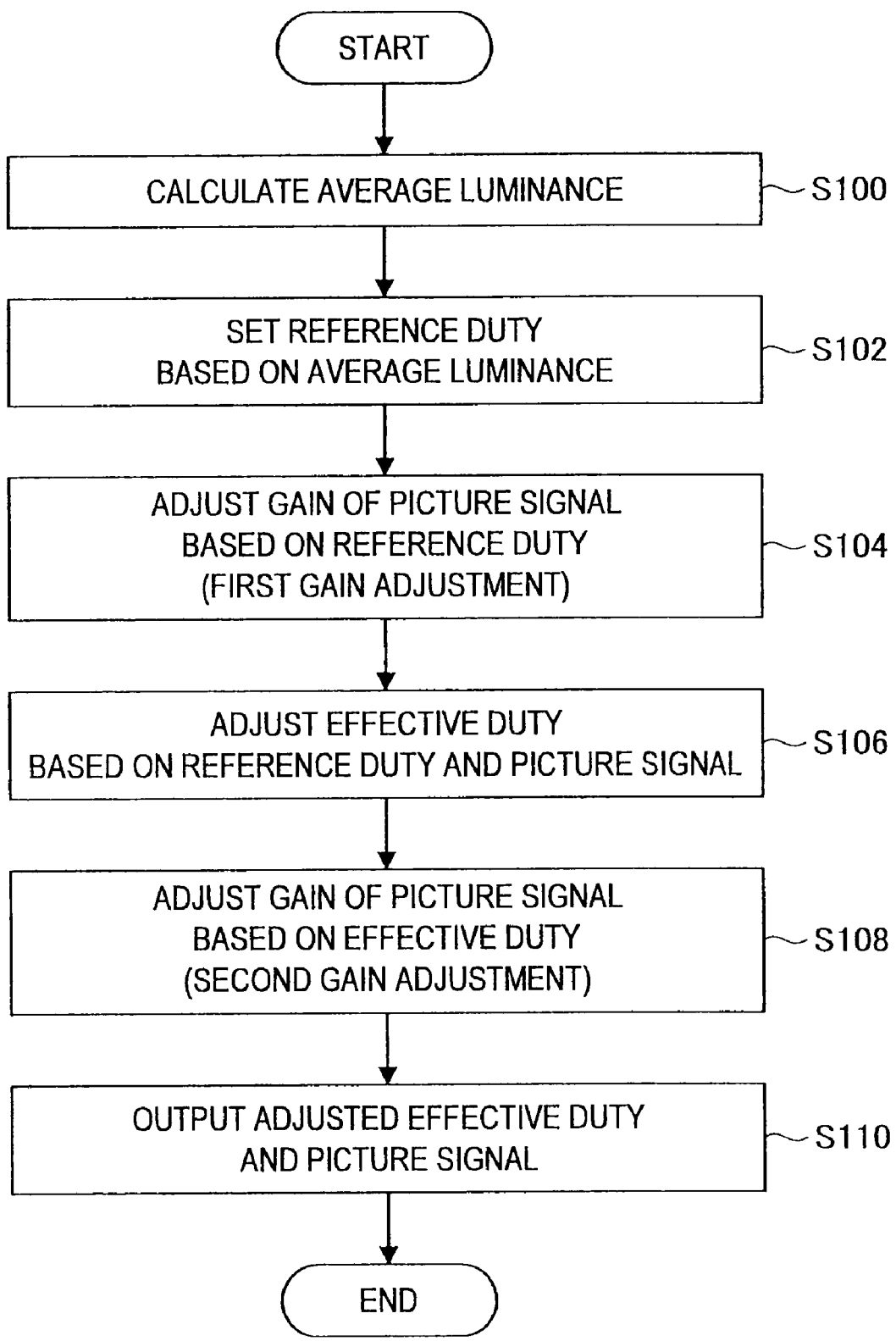
FIG. 17 is a flow diagram that shows an example of the method of processing a picture signal, according to an embodiment of the present invention.

Next, there will be described a method of processing a picture signal, according to an embodiment of the present invention. FIG. 17 is a flow diagram that shows an example of the method of processing a picture signal, according to an embodiment of the present invention, where shown is an example of the method of controlling the luminous time within one frame period and the gain of a picture signal. In the following, the explanation will be provided with assumption that the display device 100 executes the method of processing a picture signal, according to an embodiment of the present invention. And, in the following, the explanation will be provided with assumption that an input picture signal is a signal which corresponds to an image for each one frame period and which is provided separately for each colour of R, G, and B.

First, the display device 100 calculates average luminance of picture signals for a predetermined period from input R, G, and B picture signals (S100). Examples of the way of calculating average luminance in step S100 include the arithmetic mean, but are not limited thereto. And, the above-mentioned predetermined period can be one frame period, for example.

The display device 100 sets a reference duty, based on the average luminance calculated in step S100 (S102). Now, the display device 100 may set the reference duty by use of a Look Up Table in which average luminance for one frame period (predetermined period) and reference duties are correlated to each other, for example.

The display device 100 adjusts the respective gains of the input R, G, and B picture signals, based on the reference duty set in step S102 (S104: first gain adjustment). Now, the display device 100 may adjust the gains by multiplying respectively the input R, G, and B picture signals by the reference duty set in step S102, for example.

The display device 100 adjusts an effective duty, based on the reference duty set in step S102 and the picture signals (S106). Now, the display device 100 may adjust the effective duty by multiplying the reference duty by the maximum value of the luminance of the picture signals, as shown in Equation 9, based on the maximum value of the luminance of the input R, G, and B picture signal shown in Equation 8, for example.

The display device 100 adjusts the gains of the picture signals adjusted in step S104, based on the effective duty adjusted in step S106 (S108: second gain adjustment). Now, the display device 100 may adjust the gains of the picture signals by amplifying the gains of the picture signals according to the reduction ratio of the effective duty to the reference duty, as shown in Equation 10-Equation 12, for example. Therefore, a luminescence amount regulated with the effective duty and the adjusted gains of the picture signals is as the same as the luminescence amount before the adjustment.

The display device 100 outputs the effective duty adjusted in step S106 and the picture signals with their gains adjusted in step S108 (S110). For example, the display device 100 outputs synchronously the effective duty and the picture signals in step S110.

As described above, by use of the method of processing a picture signal according to an embodiment of the present invention, the display device 100 can set a reference duty of an input picture signal according to average luminance for one frame period (predetermined period), adjust the luminous time (efficient duty) within one frame period with the luminescence amount maintained as the same, and adjust the gain of the picture signal, based on the set reference duty In the above, the preferred embodiments of the present invention have been described with reference to the accompanying drawings, whilst the present invention is not limited the above examples, of course. It should be understood by those skilled in the art that various modifications, combinations, sub-combinations and alternations may occur depending on design requirements and other factors insofar as they are within the scope of the appended claims or the equivalents thereof.

For example, with regard to the display device 100 according to an embodiment of the present invention shown in FIG. 1, an input picture signal is explained as a digital signal, though it is not limited thereto. For example, a display device according to an embodiment of the present invention may include an A/D converter (Analogue to Digital converter), convert an input analogue signal (picture signal) into a digital signal, and process the converted picture signal.

And, with regard to the luminous time controller according to an embodiment of the present invention shown in FIG. 12, there has been shown the configuration where the gain adjuster 208 adjusts the gain of a picture signal so that the luminescence amount remains the same, based on the effective duty (Duty') adjusted by the luminous time adjuster 206. However, embodiments of the present invention are not limited thereto; for example, based on how much the gain of a picture signal by a gain adjuster is amplified, a luminous time adjuster may set an effective duty (Duty') so that the luminance amount remains the same.

And, for the luminous time controller according to an embodiment of the present invention, there has been shown the configuration for setting, in correspondence to an input picture signal, a reference duty for regulating a luminescence amount for one frame. However, embodiments of the present invention are not limited thereto; for example, a reference duty may be a setting value predetermined independently of a picture signal.

Furthermore, the above explanation has shown that a program (computer program) is provided for causing a computer to function as the display device 100 according an embodiment of the present invention, whilst a further embodiment of the present invention may provide as well a memory medium in which the above-mentioned program is stored.

The above-mentioned configurations represent exemplary embodiments of the present invention, of course belonging to the technical scope of the present invention.

The invention claimed is:

1. A display device including a display unit having pixels, each of which includes a luminescence element that individually becomes luminous depending on a current amount and a pixel circuit for controlling a current applied to the luminescence element according to a voltage signal, scan lines which supply a selection signal for selecting pixels to be luminous to the pixels in a predetermined scanning cycle, and data lines which supply to the pixels the voltage signal according to an input picture signal, the pixels, the scan lines, and the data lines arranged in a matrix pattern, the display device comprising:
   a luminescence amount regulator that sets a reference duty for regulating a luminescence amount for each one frame, according to the input picture signal; and
   an adjuster that adjusts an effective duty that regulates, for each one frame, a luminous time for which the luminescence element is luminous, and a gain of the picture signal, based on the reference duty and the input picture signal, wherein,
   the adjuster adjusts the effective duty and the gain of the picture signal so that the luminescence amount for each one frame regulated by the reference duty and the picture signal equals to a luminescence amount for each one frame regulated with the adjusted effective duty and the adjusted gain of the picture signal, and
   the adjuster includes:
   a luminous time that adjusts for adjusting the effective duty, based on a maximum value of luminance of the picture signal for a predetermined period and the reference duty; and
   a gain adjuster that adjusts the gain of the picture signal, based on the reference duty set by the luminescence amount regulator and the effective duty adjusted by the luminous time adjuster.

2. The display device according to claim 1, wherein the adjuster adjusts the effective duty to be smaller, as a signal level of the input picture signal is smaller, so that the gain of the picture signal is amplified.

3. The display device according to claim 1, wherein,
   the luminous time adjuster sets the effective duty to a value equal to or smaller than the reference duty, and
   the gain adjuster amplifies the gain of the picture signal, according to a reduction ratio of the effective duty to the reference duty.

4. The display device according to claim 1, wherein the luminous time adjuster includes:
   a peak detector that detects the maximum value of the luminance of the input picture signal for the predetermined period; and
   a luminous time adjuster that outputs the effective duty obtained by multiplying the reference duty by the maximum value of the luminance detected by the peak detector, and
   wherein the gain adjuster includes:
   a first gain adjuster that multiplies the input picture signal by the reference duty; and
   a second gain adjuster that divides the adjusted picture signal output from the first gain adjuster by the effective duty output from the luminous time adjuster.

5. The display device according to claim 1, further comprising:
   an average luminance calculator that calculates average luminance for a predetermined period of the input picture signal, wherein
   the luminescence amount regulator sets the reference duty depending on the average luminance calculated by the average luminance calculator.

6. The display device according to claim 5, wherein the average luminance calculator includes:
   a current ratio adjuster that multiplies primary colour signals of the picture signal respectively by adjustment values for the respective primary colour signals based on a voltage-current characteristic; and
   an average value calculator that calculates average luminance for the predetermined period of the picture signals output from the current ratio adjuster.

7. The display device according to claim 5, wherein the luminescence amount regulator holds a look-up table in which luminance of a picture signal is correlated to the reference duty, and sets the reference duty unique to the average luminance calculated by the average luminance calculator.

8. The display device according to claim 1, further comprising:
   a linear converter that adjusts the input picture signal to a linear picture signal by gamma adjustment, wherein
   the picture signal input into the adjuster is the picture signal output from the linear converter.

9. The display device according to claim 1, further comprising:
   a gamma converter that performs gamma adjustment according to a gamma characteristic of the display unit on the picture signal adjusted by the adjuster.

10. A picture signal processing method for a display device including a display unit having pixels, each of which includes a luminescence element that individually becomes luminous depending on a current amount and a pixel circuit that controls a current applied to the luminescence element according to a voltage signal, scan lines which supply a selection signal that selects pixels to be luminous to the pixels in a predetermined scanning cycle, and data lines which supply to the pixels the voltage signal according to an input picture signal, the pixels, the scan lines, and the data lines arranged in a matrix pattern, the picture signal processing method comprising:
   setting a reference duty that regulates a luminescence amount for each one frame, according to the input picture signal; and
   adjusting an effective duty that regulates, for each one frame, a luminous time for which the luminescence element is luminous, and a gain of the picture signal, based on the reference duty and the input picture signal, wherein
   the adjusting adjusts the effective duty and the gain of the picture signal so that the luminescence amount for each one frame regulated with the reference duty and the picture signal equals to a luminescence amount for each one frame regulated with the adjusted effective duty and the adjusted gain of the picture signal, and the adjusting includes:

adjusting the effective duty, based on a maximum value of luminance of the picture signal for a predetermined period and the reference duty; and adjusting the gain of the picture signal, based on the reference duty set in the adjusting and the effective duty adjusted in the adjusting the effective duty.

11. The picture signal processing method according to claim 10, wherein the step of adjusting adjusts the effective duty to be smaller, as a signal level of the input picture signal is smaller, so that the gain of the picture signal is amplified.

12. The picture signal processing method according to claim 10, wherein, the adjusting the effective duty sets the effective duty to a value equal to or smaller than the reference duty, and the adjusting the gain amplifies the gain of the picture signal, according to a reduction ratio of the effective duty to the reference duty.

13. The picture signal processing method according to claim 10, wherein the adjusting the effective duty includes:

detecting the maximum value of the luminance of the input picture signal for the predetermined period; and outputting the effective duty obtained by multiplying the reference duty by the maximum value of the maximum value of the luminance detected, and wherein the adjusting the gain includes:

multiplying the input picture signal by the reference duty; and dividing the adjusted picture signal output by the multiplying the input picture signal by the reference duty by the effective duty.

14. The picture signal processing method according to claim 10, further comprising:

calculating average luminance for a predetermined period of the input picture signal, wherein the setting sets the reference duty depending on the average luminance calculated in the step of calculating average luminance.

15. The picture signal processing method according to claim 14, wherein the calculating average luminance includes:

multiplying primary colour signals of the picture signal respectively by adjustment values for respective primary colour signals based on a voltage-current characteristic; and calculating average luminance for the predetermined period of the picture signals output by the seventh step.

16. The picture signal processing method according to claim 14, wherein, a look-up table in which luminance of a picture signal is correlated to the reference duty is held in the adjusting, and the adjusting sets the reference duty unique to the average luminance calculated in the step of calculating average luminance.

17. The picture signal processing method according to claim 10, further comprising:

adjusting the input picture signal to a linear picture signal by gamma adjustment, wherein the picture signal input in the adjusting is the picture signal output by the adjusting to a linear picture signal.

18. The display device according to claim 10, further comprising:

performing gamma adjustment according to a gamma characteristic of the display unit on the picture signal adjusted in the step of adjusting.

19. A non-transitory computer readable storage medium on which is stored a program related to a display device including a display unit having pixels, each of which includes a luminescence element that individually becomes luminous depending on a current amount and a pixel circuit for controlling a current applied to the luminescence element according to a voltage signal, scan lines which supply a selection signal for selecting pixels to be luminous to the pixels in a predetermined scanning cycle, and data lines which supply to the pixels the voltage signal according to an input picture signal, the pixels, the scan lines, and the data lines arranged in a matrix pattern, the program configured to cause a computer to function as:

means for setting a reference duty for regulating a luminescence amount for each one frame, according to the input picture signal; and means for adjusting an effective duty that regulates, for each one frame, a luminous time for which the luminescence element is luminous, and a gain of the picture signal, based on the reference duty and the input picture signal, wherein the adjuster includes:

a luminous time that adjusts for adjusting the effective duty, based on a maximum value of luminance of the picture signal for a predetermined period and the reference duty; and a gain adjuster that adjusts the gain of the picture signal, based on the reference duty set by the luminescence amount regulator and the effective duty adjusted by the luminous time adjuster.

* * * * *